(12) United States Patent
     Takahashi

(10) Patent No.: US 9,633,789 B2
(45) Date of Patent: Apr. 25, 2017

(54) LAMINATED CAPACITOR MOUNTED STRUCTURE

(71) Applicant: Murata Manufacturing Co., Ltd., Nagaokakyo-shi, Kyoto-fu (JP)

(72) Inventor: Masaru Takahashi, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 148 days.

(21) Appl. No.: 14/734,056

(22) Filed: Jun. 9, 2015

(65) Prior Publication Data

US 2015/0364261 A1    Dec. 17, 2015

(30) Foreign Application Priority Data

Jun. 13, 2014   (JP) ................................. 2014-122309
Mar. 23, 2015   (JP) ................................. 2015-059769

(51) Int. Cl.
     *H01G 4/30*       (2006.01)
     *H01G 4/06*       (2006.01)
     *H01G 2/06*       (2006.01)
     *H01G 4/232*      (2006.01)
     *H05K 3/34*       (2006.01)
     (Continued)

(52) U.S. Cl.
     CPC ............... *H01G 4/06* (2013.01); *H01G 2/065* (2013.01); *H01G 4/232* (2013.01); *H01G 4/2325* (2013.01); *H01G 4/30* (2013.01); *H05K 3/3442* (2013.01); *H01G 4/12* (2013.01); *H05K 1/181* (2013.01); *H05K 2201/10015* (2013.01); *Y02P 70/613* (2015.11)

(58) Field of Classification Search
     CPC ............ H01G 4/30; H01G 4/005; H01G 4/06; H01G 4/012; H01G 4/12; H01G 4/228
     See application file for complete search history.

(56) References Cited

U.S. PATENT DOCUMENTS 7,685,703 B1 *   3/2010   Devoe ................. H01G 4/0085
                                                       29/832
8,054,607 B2 *   11/2011   Lee ....................... H01G 4/005
                                                       361/303

(Continued)

FOREIGN PATENT DOCUMENTS

JP    2006-12976 A    1/2006
JP    2012-151175 A   8/2012

OTHER PUBLICATIONS

Official Communication issued in corresponding Korean Patent Application No. 10-2015-0070180, mailed on Apr. 18, 2016.

*Primary Examiner* — Nguyen Ha
(74) *Attorney, Agent, or Firm* — Keating & Bennett, LLP

(57) ABSTRACT

A mounted structure includes a laminated capacitor, a wiring substrate, and a joint material. The laminated capacitor includes a body with dielectric layers and internal electrode layers alternately stacked, and an external electrode connected to the internal electrode layers. The body includes a side surface coated with a side surface coating portion of the external electrode. The joint material is joined to the side surface coating portion and a land provided on the wiring substrate so as to cover the outer surfaces thereof. The outer end portion of the thickest portion of the joint material covering the side surface coating portion is located farther outside an outer end of the land in a direction perpendicular or substantially perpendicular to a side surface of the body.

20 Claims, 15 Drawing Sheets

(51) Int. Cl.
*H01G 4/12* (2006.01)
*H05K 1/18* (2006.01)

(56) References Cited

U.S. PATENT DOCUMENTS

| 8,232,479 B2* | 7/2012 | Satou | H01G 2/065 |
| | | | 174/126.1 |
| 8,988,853 B2* | 3/2015 | Kim | H01G 4/228 |
| | | | 361/301.4 |
| 9,024,202 B2* | 5/2015 | Ahn | H01G 2/065 |
| | | | 174/258 |
| 2009/0002921 A1* | 1/2009 | Ritter | H01C 1/148 |
| | | | 361/321.3 |

* cited by examiner

FIG. 17

| | | | VERIFICATION EXAMPLE 1 | VERIFICATION EXAMPLE 2 | VERIFICATION EXAMPLE 3 |
|---|---|---|---|---|---|
| MANUFACTURING CONDITION | LAMINATED CERAMIC CAPACITOR (COMMON TO EACH LEVEL) | Lc [mm] | 1.77 | 1.77 | 1.77 |
| | | Wc [mm] | 0.96 | 0.96 | 0.96 |
| | | Tc [mm] | 0.96 | 0.96 | 0.96 |
| | | Le [mm] | 0.535 | 0.535 | 0.535 |
| | | Ge [mm] | 0.7 | 0.7 | 0.7 |
| | WIRING SUBSTRATE (COMMON TO EACH LEVEL) | Lb [mm] | 3 | 2.2 | 1.72 |
| | | Ll [mm] | 1.15 | 0.75 | 0.51 |
| | | Wl [mm] | 0.92 | 0.92 | 0.92 |
| | | Gl [mm] | 0.7 | 0.7 | 0.7 |
| | STENCIL | FIRST LEVEL APERTURE VOLUME [mm³] | 0.0529 | 0.0345 | 0.02346 |
| | | SECOND LEVEL APERTURE VOLUME [mm³] | 0.08464 | 0.0552 | 0.03754 |
| | | THIRD LEVEL APERTURE VOLUME [mm³] | 0.1058 | 0.069 | 0.04692 |
| | | FOURTH LEVEL APERTURE VOLUME [mm³] | 0.1587 | 0.1035 | 0.07038 |
| TEST RESULT | | DISTANCE D (INCLUDING ALL OF LEVELS) AVERAGE VALUE [mm] | -0.61 | -0.20 | 0.07 |
| | | SOUND PRESSURE OF NOISE (INCLUDING ALL OF LEVELS) AVERAGE VALUE [dB] | 87.5 | 81.9 | 74.7 |
| | | CV VALUE [%] | 2.7 | 1.93 | 1.54 |

LAMINATED CAPACITOR MOUNTED STRUCTURE

BACKGROUND OF THE INVENTION

1. Field of the Invention

The present invention relates to a structure mounted with a laminated capacitor (hereinafter, also referred to simply as a mounted structure), which includes a laminated capacitor mounted on a wiring substrate via a joint material.

2. Description of the Related Art

In recent years, with increases in performance of electronic devices, laminated ceramic capacitors as laminated capacitors have been progressively increased in capacitance. In high-capacitance laminated ceramic capacitors, high-dielectric-constant ceramic materials such as barium titanate are used as dielectric materials.

The high-dielectric-constant ceramic materials have piezoelectricity and electrostriction, and therefore will have mechanical distortion generated when a voltage is applied, in the case of laminated ceramic capacitors including dielectric layers of the high-dielectric-constant ceramic materials.

Therefore, when an alternating-current voltage or a direct-current voltage with an alternating-current component superimposed thereon is applied to a high-capacitance laminated ceramic capacitor mounted on a wiring substrate, vibrations will be generated due to mechanical distortion generated in the ceramic material, and the vibrations will propagate to the wiring substrate to vibrate the circuit substrate.

In this regard, when due to the vibrations propagated, the circuit substrate vibrates at a frequency of 20 Hz to 20 kHz in an audio-frequency range, noise referred to as so-called "acoustic noise" will be generated.

Typically, laminated ceramic capacitors have a pair of external electrodes provided on the surface of a body including dielectric layers and internal electrode layers, and the pair of external electrodes is mounted on a wiring substrate by being correspondingly joined to a pair of lands provided on the wiring substrate with a joint material such as a solder. In that case, it is common that the pair of external electrodes mentioned above is provided so as to coat a pair of side surfaces of the body, located to have a separation from each other in a predetermined direction.

Documents that disclose laminated capacitor mounted structures where the laminated ceramic capacitor configured as described above is mounted on a wiring substrate include, for example, JP 2012-151175 A.

In the case of mounting, onto a wiring substrate, the laminated ceramic capacitor provided with the external electrodes to coat the sides of the body as described above via a joint material, the melted joint material will wet upwardly along the outer surfaces of the external electrodes provided to coat the side surfaces of the body, and joint portions will be formed to cover the surfaces of the external electrodes. Therefore, the above-mentioned vibrations generated in the laminated ceramic capacitor will propagate entirely to the wiring substrate through the joint portions formed by the joint material wetting upwardly.

In this regard, in order to reduce the propagation of the vibrations for the suppression of noise generation, it is conceivable that the propagation path for the vibrations is reduced by limiting the amount of the joint material which will wet upwardly in mounting. However, it is extremely difficult to control, with accuracy, the amount of the joint material wetting upwardly in mounting. Therefore, as a result of variations in the amount of wetting upward, the noise generated will also vary significantly, thus making it extremely difficult to stably produce circuit substrates with noise suppressed.

SUMMARY OF THE INVENTION

Therefore, preferred embodiments of the present invention provide a laminated capacitor mounted structure that significantly reduces or prevents variations in noise.

A laminated capacitor mounted structure according to a first aspect of various preferred embodiments of the present invention includes a laminated capacitor mounted on a wiring substrate via a joint material. The laminated capacitor includes a body including dielectric layers and internal electrode layers alternately stacked, and an external electrode connected to at least a portion of the internal electrode layers, and the body includes a first principal surface and a second principal surface opposed to each other, and side surfaces that connect the first principal surface and the second principal surface. The laminated capacitor is mounted on the wiring substrate, with the first principal surface of the body opposed to a main surface of the wiring substrate. The external electrode includes a side surface coating portion that coats the side surface of the body, and the wiring substrate includes a land on the main surface. The joint material is joined to the side surface coating portion and the land, so as to cover at least a portion of the outer surface of the side surface coating portion and at least a portion of the outer surface of the land. A constricted portion is provided at a surface of the joint material located between an outer end portion of the thickest portion of the joint material covering the side surface coating portion and an outer end of the land.

In the laminated capacitor mounted structure according to the first aspect of various preferred embodiments of the present invention, the constricted portion is preferably partially located inside the outer end of the land in a direction perpendicular or substantially perpendicular to the side surface of the body.

In the laminated capacitor mounted structure according to the first aspect of various preferred embodiments of the present invention, the joint material preferably covers the side surface coating portion, and also includes a bulged portion so as to be spaced away from the body.

In the laminated capacitor mounted structure according to the first aspect of various preferred embodiments of the present invention, the outer end portion is preferably located farther outside the outer end of the land in a direction perpendicular or substantially perpendicular to the side surface of the body.

In the laminated capacitor mounted structure according to the first aspect of various preferred embodiments of the present invention, the constricted portion is preferably located between the internal electrode layer closest to the first principal surface among the internal electrode layers and the land in a direction perpendicular or substantially perpendicular to the first principal surface.

A laminated capacitor mounted structure according to a second aspect of various preferred embodiments of the present invention includes a laminated capacitor mounted on a wiring substrate via a joint material. The laminated capacitor includes a body including dielectric layers and internal electrode layers alternately stacked, and an external electrode connected to at least a portion of the internal electrode layers, and the body includes a first principal surface and a second principal surface opposed to each other, and side surfaces that connect the first principal surface and the second principal surface. The laminated capacitor is mounted on the wiring substrate, with the first principal surface of the body opposed to a main surface of the wiring substrate. The external electrode includes a side surface coating portion that coats the side surface of the body, and the wiring substrate includes a land on the main surface. The joint material is joined to the side surface coating portion and the land, so as to cover at least a portion of the outer surface of the side surface coating portion and at least a portion of the outer surface of the land. The joint material covers the side surface coating portion, and also includes a bulged portion so as to be spaced away from the body.

In the laminated capacitor mounted structure according to the second aspect of various preferred embodiments of the present invention, the outer end portion of the thickest portion of the joint material covering the side surface coating portion is preferably located farther outside the outer end of the land in a direction perpendicular or substantially perpendicular to the side surface of the body.

A laminated capacitor mounted structure according to a third aspect of various preferred embodiments of the present invention includes a laminated capacitor mounted on a wiring substrate via a joint material. The laminated capacitor includes a body that includes dielectric layers and internal electrode layers alternately stacked, and an external electrode connected to at least a portion of the internal electrode layers, and the body includes a first principal surface and a second principal surface opposed to each other, and side surfaces that connect the first principal surface and the second principal surface. The laminated capacitor is mounted on the wiring substrate, with the first principal surface of the body opposed to a main surface of the wiring substrate. The external electrode includes a side surface coating portion that coats the side surface of the body, and the wiring substrate includes a land on the main surface. The joint material is joined to the side surface coating portion and the land, so as to cover at least a portion of the outer surface of the side surface coating portion and at least a portion of the outer surface of the land. The outer end portion of the thickest portion of the joint material covering the side surface coating portion is located farther outside the outer end of the land in a direction perpendicular or substantially perpendicular to the side surface of the body.

In the laminated capacitor mounted structures according to the first to third aspects of various preferred embodiments of the present invention, the outer end of the land is preferably located in the same position as, or inside the outer surface of the side surface coating portion in a direction perpendicular or substantially perpendicular to the side surface of the body.

In the laminated capacitor mounted structures according to the first to third aspects of various preferred embodiments of the present invention, the stacking direction of the dielectric layers and the internal electrode layers is preferably perpendicular or substantially perpendicular to the main surface of the wiring substrate.

In the laminated capacitor mounted structures according to the first to third aspects of various preferred embodiments of the present invention, the thickness of the dielectric layer as a portion that defines the first principal surface among the dielectric layers is preferably larger than the thickness of the dielectric layer as a portion that defines the second principal surface among the dielectric layers.

In the laminated capacitor mounted structures according to the first to third aspects of various preferred embodiments of the present invention, the body may include a first capacitance portion and a second capacitance portion separated in the stacking direction by a separation portion that does not provide or generate any capacitance. In that case, the total number of the internal electrode layers included in the first capacitance portion is larger than the total number of the internal electrode layers included in the second capacitance portion, and the total thickness of the first capacitance portion is preferably larger than the total thickness of the second capacitance portion, and furthermore, the first capacitance portion is preferably located between the second principal surface and the second capacitance portion.

In the laminated capacitor mounted structures according to the first to third aspects of various preferred embodiments of the present invention, the thickness of the separation portion is larger than both the spacing of the internal electrode layers included in the first capacitance portion in the stacking direction and the spacing of the internal electrode layers included in the second capacitance portion in the stacking direction.

According to various preferred embodiments of the present invention, a laminated capacitor mounted structure significantly reduces or prevents variations in noise.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 17 is a table showing manufacturing conditions and test results of Verification Examples 1 to 3 in the verification test.

DETAILED DESCRIPTION OF THE PREFERRED EMBODIMENTS

Figure 1:
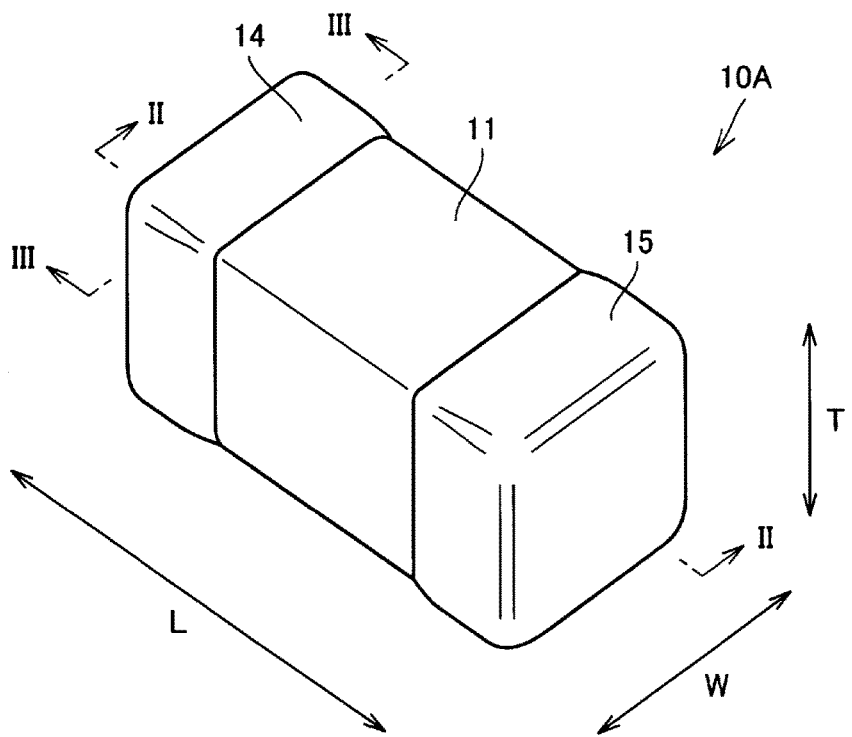
FIG. 1 is a perspective view of a laminated ceramic capacitor provided for a mounted structure in accordance with Preferred Embodiment 1 of the present invention.

Preferred embodiments of the present invention will be described in detail below with reference to the drawings. Laminated capacitors to which preferred embodiments of the present invention are applied to be mounted on a wiring substrate preferably include, for example, laminated ceramic capacitors that use a ceramic material as a dielectric material; and laminate-type metallized film capacitors that use a resin film as the dielectric material, and among others, laminated ceramic capacitors will be described by way of example in the following preferred embodiments. It is to be noted that the same or common elements in the following preferred embodiments are denoted by the same reference numerals in the figures, and descriptions of the elements will not be repeated.

Preferred Embodiment 1

Figure 2:
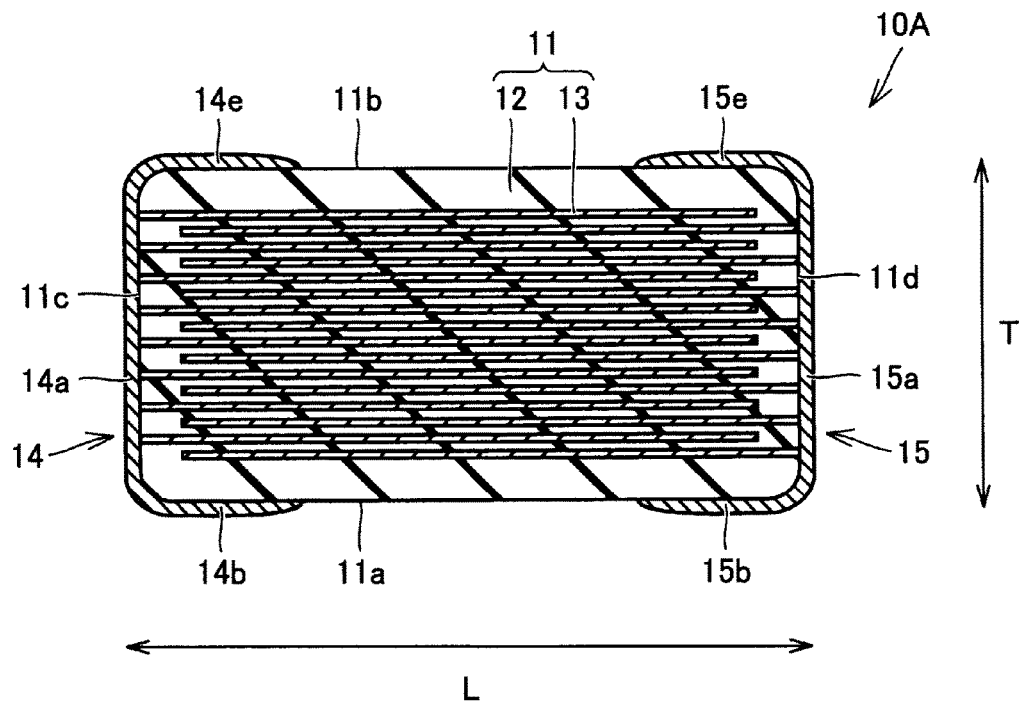
FIG. 2 is a schematic cross-sectional view along the line II-II shown in FIG. 1.
Figure 3:
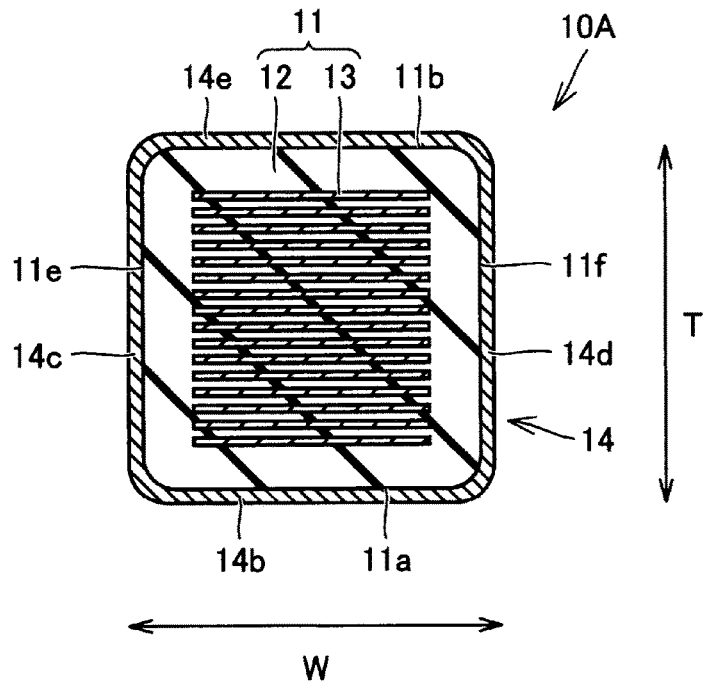
FIG. 3 is a schematic cross-sectional view along the line III-III shown in FIG. 1.

FIG. 1 is a perspective view of a laminated ceramic capacitor provided for a mounted structure in accordance with Preferred Embodiment 1 of the present invention. In addition, FIGS. 2 and 3 are schematic cross-sectional views along the line II-II and the line III-III respectively shown in FIG. 1. First, a laminated ceramic capacitor 10A provided for the mounted structure in accordance with the present preferred embodiment will be described with reference to FIGS. 1 to 3.

As shown in FIGS. 1 to 3, the laminated ceramic capacitor 10A preferably has a cuboid shape as a whole, and includes a body 11, a first external electrode 14 and a second external electrode 15.

As shown in FIGS. 2 and 3, the body 11, which has a cuboid shape, includes dielectric layers 12 and internal electrode layers 13 alternately stacked along a predetermined direction. The dielectric layers 12 are preferably formed from a ceramic material containing, for example, barium titanate ($BaTiO_3$) as its main constituent. Furthermore, the dielectric layers 12 may contain a Mn compound, a Mg compound, a Si compound, a Co compound, a Ni compound, a rare-earth compound, etc. as accessory constituents for a ceramic powder to serve as a raw material for ceramic sheets as described later. On the other hand, the internal electrode layers 13 are preferably formed from a metallic material typified by, for example, Ni, Cu, Ag, Pd, a Ag—Pd alloy, and Au.

The body 11 is preferably made in such a way that a plurality of material sheets with a conductive paste to serve as the internal electrode layers 13 printed on surfaces of ceramic sheets (so-called green sheets) to serve as the dielectric layers is prepared, and the plurality of the material sheets are stacked, and subjected to pressure bonding and firing.

It is to be noted that the material of the dielectric layers 12 is not limited to the above-mentioned ceramic material containing barium titanate as its main constituent, but other high-dielectric-constant ceramic materials (containing, as their main constituent, $CaTiO_3$, $SrTiO_3$, or $CaZrO_3$, for example) may be selected as the material of the dielectric layers 12. In addition, the material of the internal electrode layers 13 is also not limited to the metallic material mentioned above, but other conductive materials may be selected as the material of the internal electrode layers 13.

As shown in FIGS. 1 to 3 herein, the stacking direction of the dielectric layers 12 and internal electrode layers 13 in the body 11 is defined as a thickness direction T, the spacing direction of the first external electrode 14 and second external electrode 15 is defined as a length direction L of the laminated ceramic capacitor 10A, and the direction perpendicular or substantially perpendicular to both the length direction L and the thickness direction T is defined as a width direction W, and these terms are used in the subsequent description.

Furthermore, as shown in FIGS. 2 and 3, among six surfaces of the body 11, a pair of surfaces opposed to each other in the thickness direction T is defined as a first surface 11a and a second surface 11b, a pair of surfaces opposed to each other in the length direction L is defined as a third surface 11c and a fourth surface 11d, a pair of surfaces opposed to each other in the width direction W is defined as a fifth surface 11e and a sixth surface 11f, and these terms are used in the subsequent description.

As shown in FIGS. 1 and 2, the first external electrode 14 and the second external electrode 15 cover both ends of the body 11 in the length direction L, and have a separation from each other. The first external electrode 14 and the second external electrode 15 each include a conductive film.

The first external electrode 14 and the second external electrode 15 include, for example, a laminated film of a sintered metallic layer and a plated layer. The sintered metallic layer is formed by, for example, baking a paste such as Cu, Ni, Ag, Pd, an Ag—Pd alloy, and Au. The plated layer includes, for example, a Ni plated layer and a Sn plated layer that covers the Ni plated layer. The plated layer may be instead a Cu plated layer or an Au plated layer. In addition, the first external electrode 14 and the second external electrode 15 may include only the plated layer.

Furthermore, it is also possible to use a conductive resin paste as the first external electrode 14 and the second external electrode 15. When a conductive resin paste is used as the first external electrode 14 and the second external electrode 15, the resin component included in the conductive resin paste produces the effect of absorbing vibrations generated in the body 11, thus making it possible to effectively attenuate vibrations propagating from the body 11 to the outside, which is advantageous for noise reduction.

As shown in FIGS. 2 and 3, the first external electrode 14 includes a first coating portion 14a that covers the third surface 11c, a second coating portion 14b that covers a portion of the first surface 11a, which is located closer to the third surface 11c, a third coating portion 14c that covers a portion of the fifth surface 11e, which is located closer to the third surface 11c, a fourth coating portion 14d that covers a portion of the sixth surface 11f, which is located closer to the third surface 11c, and a fifth coating portion 14e that covers a portion of the second surface 11b, which is located closer to the third surface 11c.

On the other hand, the second external electrode 15 includes a sixth coating portion 15a that covers the fourth surface 11d, a seventh coating portion 15b that covers a portion of the first surface 11a, which is located closer to the fourth surface 11d, an eighth coating portion (not shown in FIGS. 2 and 3) that covers a portion of the fifth surface 11e, which is located closer to the fourth surface 11d, a ninth coating portion (not shown in FIGS. 2 and 3) that covers a portion of the sixth surface 11f, which is located closer to the fourth surface 11d, and a tenth coating portion 15e that covers a portion of the second surface 11b, which is located closer to the fourth surface 11d.

As shown in FIG. 2, one of the pair of internal electrode layers 13 adjacent to each other with the dielectric layer 12 sandwiched therebetween along the stacking direction is electrically connected to the first external electrode 14, whereas the other of the pair of internal electrode layers 13 adjacent to each other with the dielectric layer 12 sandwiched therebetween along the stacking direction is electrically connected to the second external electrode 15. Thus, a plurality of capacitor elements is electrically connected in parallel between the first external electrode 14 and second external electrode 15 as a pair of external electrodes.

It is to be noted that the laminated ceramic capacitor 10A according to the present preferred embodiment is configured so that the outer dimension Lc (see FIG. 5) in the length direction L is longer than the outer dimension Tc (see FIGS. 5 and 6) in the thickness direction T and the outer dimension Wc (see FIG. 6) in the width direction W, and configured that the outer dimension Tc in the thickness direction T and the outer dimension Wc in the width direction W are, in magnitude, both about half of the outer dimension Lc in the length direction L, and the same in dimension. In addition, the outer dimensions Le (see FIG. 5) of the first external electrode 14 and second external electrode 15 in the length direction L are adapted to have the same dimension, and the distance Ge (see FIG. 5) between the first external electrode 14 and the second external electrode 15 is adjusted to an adequate distance that is able to ensure an insulation property between the first external electrode 14 and the second external electrode 15.

In this regard, example representative values of the outer dimensions Lc, Wc, and Tc of the laminated ceramic capacitor 10A include, for example, 0.25 mm×0.125 mm×0.125 mm, 0.4 mm×0.2 mm×0.2 mm, 0.6 mm×0.3 mm×0.3 mm, 0.8 mm×0.4 mm×0.4 mm, 1.0 mm×0.5 mm×0.5 mm, 1.6 mm×0.8 mm×0.8 mm, 2.0 mm×1.25 mm×1.25 mm, and 3.2 mm×1.6 mm×1.6 mm.

Figure 4:
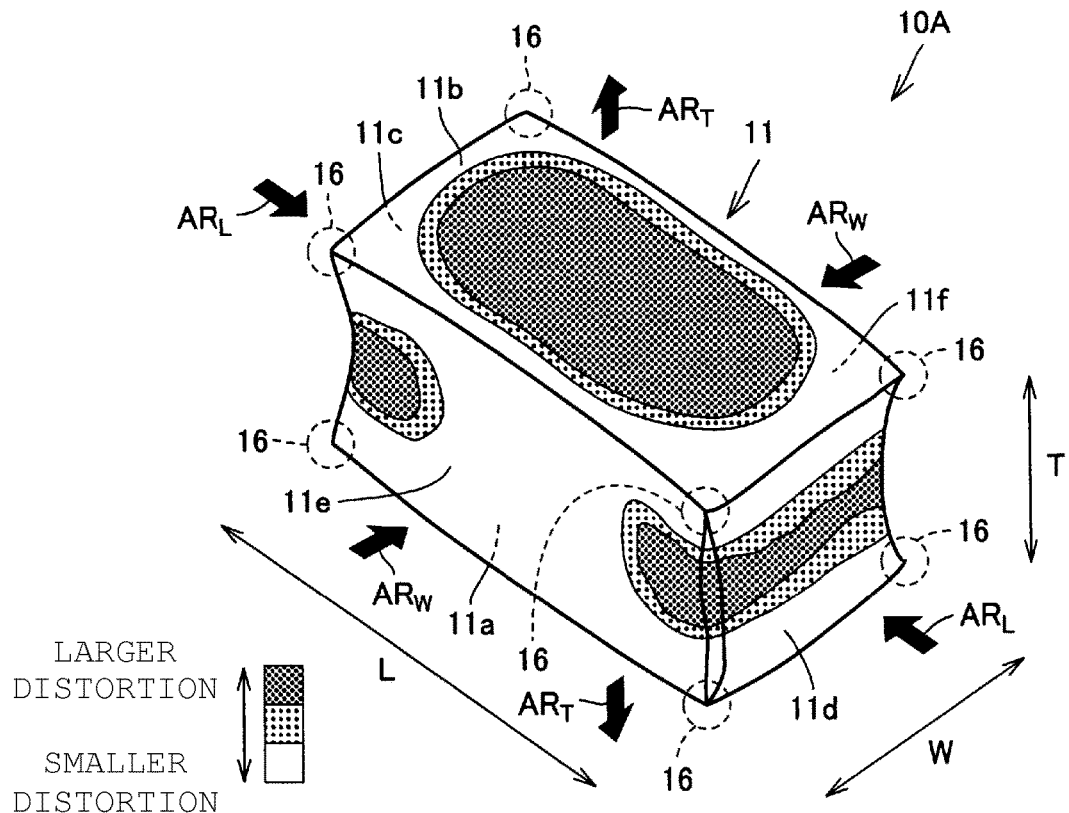
FIG. 4 is a diagram illustrating the result of simulating distortion produced when a voltage is applied to a body of the laminated ceramic capacitor shown in FIG. 1.

FIG. 4 is a diagram illustrating the result of simulating distortion produced when a voltage is applied to the body of the laminated ceramic capacitor shown in FIG. 1. Next, with reference to FIG. 4, distortion will be described which can be generated in the laminated ceramic capacitor 10A provided for the mounted structure in accordance with the present preferred embodiment.

When an alternating-current voltage or a direct-current voltage of superimposed alternating-current components is applied to the first external electrode 14 and second external electrode 15 of the laminated ceramic capacitor 10A described above, mechanical distortion is generated as shown in FIG. 4 in the body 11, which leads to distortion of the laminated ceramic capacitor 10A.

As shown in FIG. 4, during the voltage application, the body 11 is significantly distorted outwardly along the thickness direction T as indicated by arrows ART in the figure. Accordingly, the body 11 is significantly distorted inwardly along the length direction L as indicated by arrows $AR_L$ in the figure, and the body 11 is distorted inwardly along the width direction W as indicated by arrows $AR_W$ in the figure. In contrast, almost no distortion is generated at corners 16 of the body 11 which has a cuboid shape.

Therefore, the laminated ceramic capacitor 10A also has, during the voltage application, similar distortion generated, distortion will be repeatedly generated as described above in accordance with the cycle of the voltage applied to the laminated ceramic capacitor 10A. As a result, in the case of the mounted structure provided with the laminated ceramic capacitor 10A, the laminated ceramic capacitor 10A serves as a vibration source, and the vibration will propagate to a wiring substrate 20 (see FIGS. 5 and 6, etc.) to vibrate the wiring substrate 20, thus resulting in noise generation.

Figure 5:
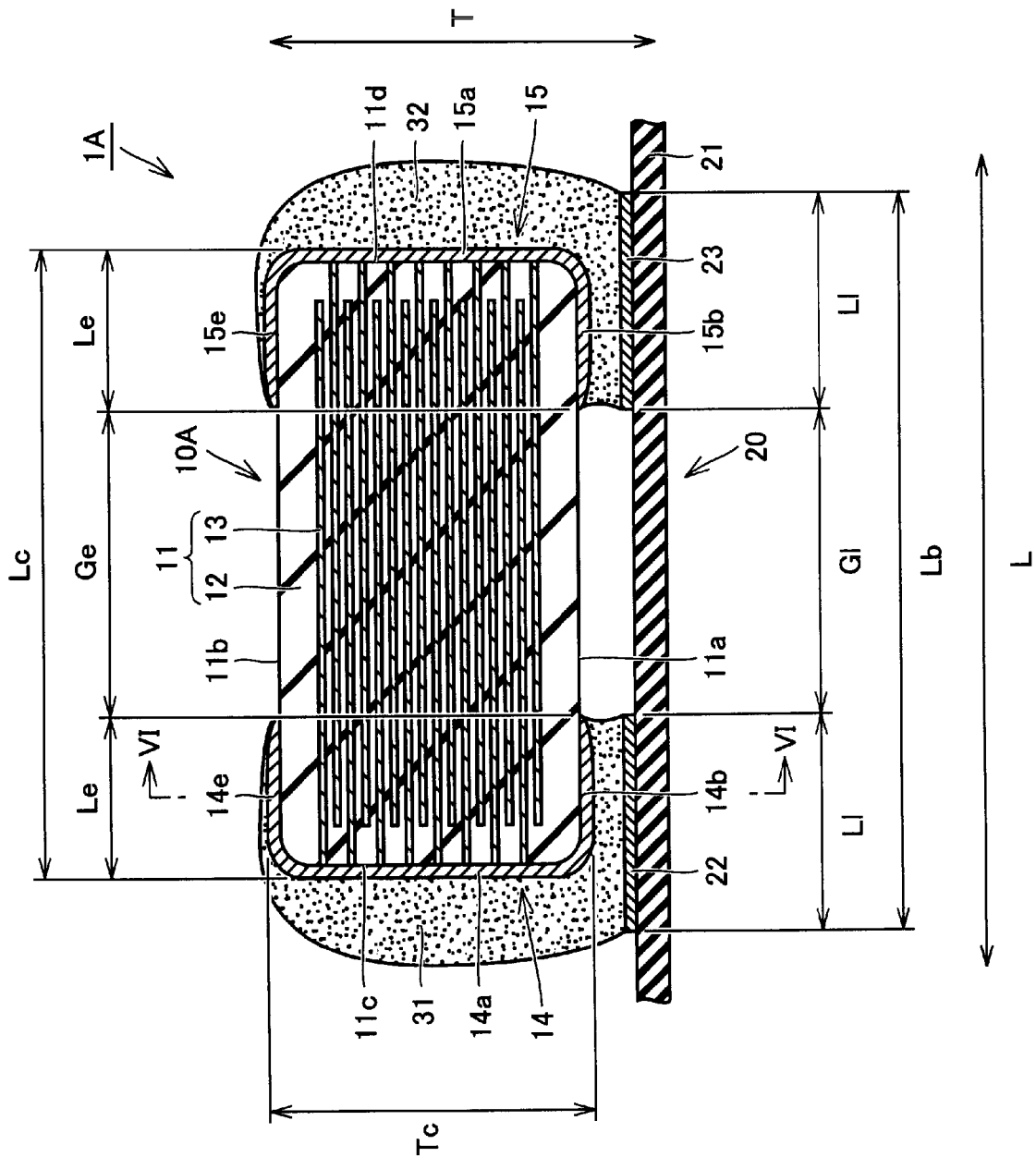
FIG. 5 is a schematic cross-sectional view of the mounted structure in accordance with Preferred Embodiment 1 of the present invention.
Figure 6:
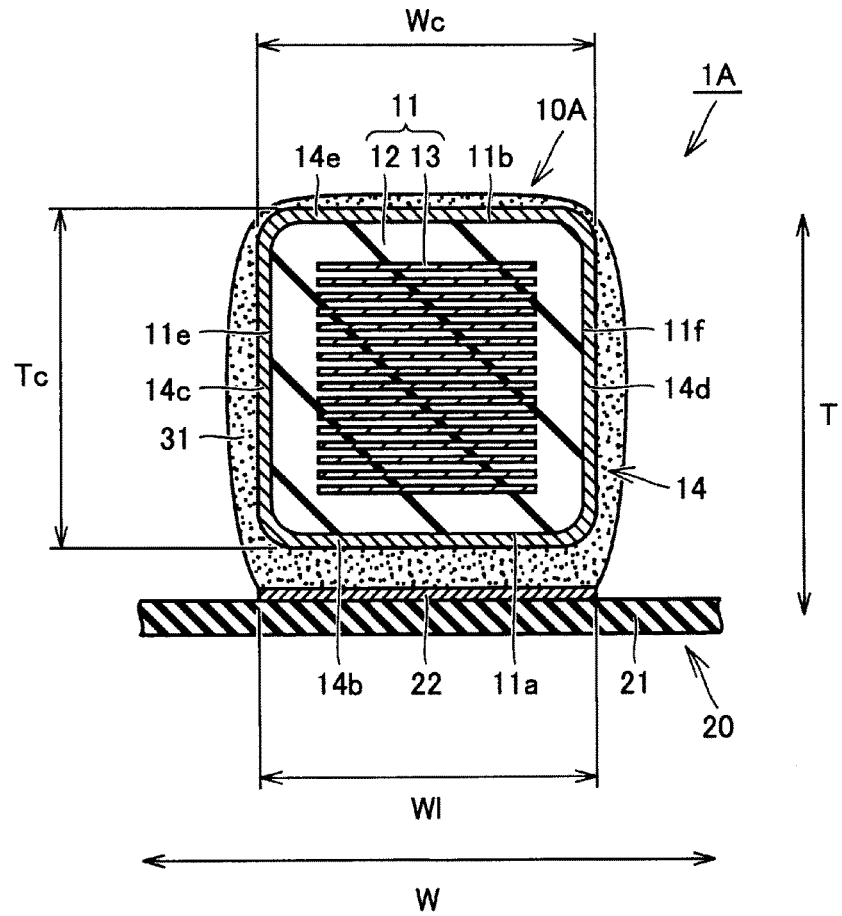
FIG. 6 is a schematic cross-sectional view along the line VI-VI shown in FIG. 5.

FIG. 5 is a schematic cross-sectional view of the mounted structure in accordance with the present preferred embodiment, and FIG. 6 is a schematic cross-sectional view along the line VI-VI shown in FIG. 5. In this regard, FIG. 5 shows a cross section of the laminated ceramic capacitor 10A in a middle position in the width direction W. Next, the mounted structure 1A in accordance with the present preferred embodiment will be described with reference to FIGS. 5 and 6.

As shown in FIGS. 5 and 6, the mounted structure 1A includes the laminated ceramic capacitor 10A described above, the wiring substrate 20, and a first joint portion 31 and a second joint portion 32 that include a solder joint material, and has the laminated ceramic capacitor 10A mounted over the wiring substrate 20 with the first joint portion 31 and second joint portion 32 interposed therebetween.

The wiring substrate 20 generally has a plate shape, and includes a base material portion 21, as well as a first land 22 and a second land 23.

The base material portion 21 has a plate shape with a pair of main surfaces, and a conductive pattern as a wiring provided on at least one of the main surfaces. As the material of the base material portion 21, materials can be used such as resin materials such as epoxy resins and ceramic materials such as alumina, or the materials with fillers, woven fabrics, etc. of inorganic materials or organic materials added thereto. In general, a glass epoxy substrate of an epoxy resin matrix with a glass woven fabric added thereto is used in a preferred manner as the base material portion 21.

The first land 22 and the second land 23 are separated from each other on the main surface of the wiring substrate 20. The first land 22 and the second land 23 correspond to portions of the conductive pattern described above, which are arranged on the base material portion 21 depending on the first external electrode 14 and second external electrode 15 of the laminated ceramic capacitor 10A. While various types of conductive materials can be used as the material of the first land 22 and second land 23, metallic materials such as copper foil are typically used in a preferred manner.

In this regard, as shown in FIG. 5, the outer dimensions L1 of the first land 22 and second land 23 in a direction parallel to the length direction L of the laminated ceramic capacitor 10A shown in the figure are adapted to be the same dimension, and the distance G1 between the first land 22 and the second land 23 along the direction is adjusted to an adequate distance that is able to ensure an insulation property between the lands. In addition, as shown in FIG. 6, the outer dimensions W1 of the first land 22 and second land 23 (the outer dimension W1 of the second land 23 is not shown) in a direction parallel to the width direction W of the laminated ceramic capacitor 10A shown in the figure are adapted to be the same dimension.

The first joint portion 31 and the second joint portion 32 are preferably formed by, for example, melting and solidifying a solder paste that is a mixture of a solder alloy and a flux as an organic material.

The solder joint material constituting the first joint portion 31 and the second joint portion 32 contains, as its main constituent, a solder alloy containing Sn. In this regard, a ternary solder of a solder alloy containing therein Sn, Ag, and Cu, or a so-called high-temperature solder of a solder alloy containing therein Sn and Sb, for example, is used as the solder joint material in a preferred manner.

The laminated ceramic capacitor 10A is placed with the first surface 11a of the body 11 opposed to the main surface of the wiring substrate 20 so that the second coating portion 14b of the first external electrode 14 is opposed to the first land 22 of the wiring substrate 20, and the seventh coating portion 15b of the second external electrode 15 is opposed to the second land 23 of the wiring substrate 20.

The first joint portion 31 joins the first external electrode 14 and first land 22 placed to be opposed, adheres to the outer surface of the first land 22, and adheres to the outer surface of the first external electrode 14 continuously on the first coating portion 14a, second coating portion 14b, third coating portion 14c, fourth coating portion 14d, and fifth coating portion 14e of the first external electrode 14.

Furthermore, the second joint portion 32 joins the second external electrode 15 and second land 23 placed to be opposed, adheres to the outer surface of the second land 23, and adheres to the outer surface of the second external electrode 15 continuously on the sixth coating portion 15a, seventh coating portion 15b, eighth coating portion (not shown in FIGS. 5 and 6), ninth coating portion (not shown in FIGS. 5 and 6), and tenth coating portion 15e of the second external electrode 15.

In this regard, the solder joint material to serve as the first joint portion 31, in mounting the laminated ceramic capacitor 10A, will melt to spread with wettability on the outer surface of the first external electrode 14, and in that regard, wet upwardly so as to not only cover the second coating portion 14b, but also cover the first coating portion 14a, the third coating portion 14c, the fourth coating portion 14d, and the fifth coating portion 14e. Therefore, the solder joint material spread with wettability is thereafter solidified to form the first joint portion 31 adhering to the outer surface of the first external electrode 14 continuously on the first coating portion 14a, the second coating portion 14b, the third coating portion 14c, the fourth coating portion 14d, and the fifth coating portion 14e as described above.

On the other hand, the solder joint material to serve as the second joint portion 32, in mounting the laminated ceramic capacitor 10A, will melt to spread with wettability on the outer surface of the second external electrode 15, and in that regard, wet upwardly so as to not only cover the seventh coating portion 15b, but also cover the sixth coating portion 15a, the eighth coating portion, the ninth coating portion, and the tenth coating portion 15e. Therefore, the solder joint material spread with wettability is thereafter solidified to form the second joint portion 32 adhering to the outer surface of the second external electrode 15 continuously on the sixth coating portion 15a, the seventh coating portion 15b, the eighth coating portion, the ninth coating portion, and the tenth coating portion 15e as described above.

In the mounted structure 1A configured as mentioned above in accordance with the present preferred embodiment, the first surface 11a of the body 11 of the laminated ceramic capacitor 10A corresponds to a first principal surface opposed to the main surface of the wiring substrate 20, whereas the second surface 11b of the body 11 of the laminated ceramic capacitor 10A corresponds to a second principal surface. Furthermore, the third surface 11c and fourth surface 11d of the body 11 of the laminated ceramic capacitor 10A respectively correspond to the side surfaces of the body 11, which are coated with the first external electrode 14 and the second external electrode 15, and the first coating portion 14a of the first external electrode 14 and the sixth coating portion 15a of the second external electrode 15 respectively correspond to side surface coating portions that coat the side surfaces of the body 11.

Furthermore, thus, in the mounted structure 1A in accordance with the present preferred embodiment, the stacking direction (that is, the thickness direction T) of the dielectric layers 12 and internal electrode layers 13 included in the body 11 is located perpendicular or substantially perpendicular to the main surface of the wiring substrate 20.

In this regard, in the mounted structure 1A in accordance with the present preferred embodiment, the above-described first joint portion 31 and second joint portion 32 of the solder joint material are characteristically configured in order to make it possible to significantly reduce or prevent variations in noise, and details of the configuration will be described later.

Figure 7:
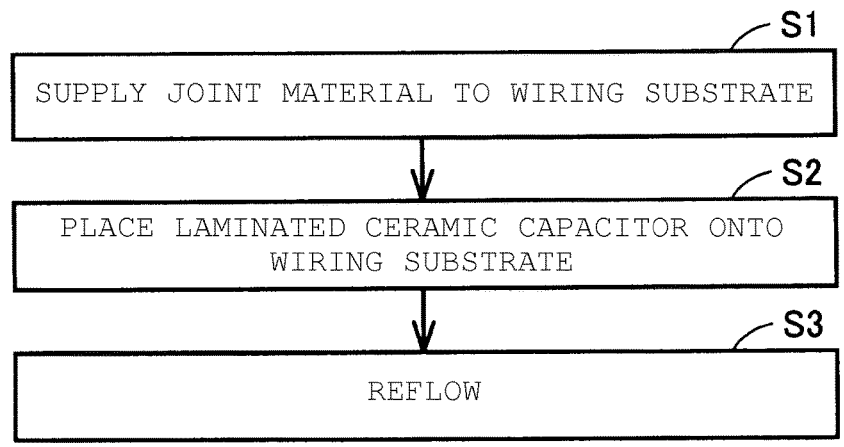
FIG. 7 is a diagram showing a manufacturing flow for the mounted structure in accordance with Preferred Embodiment 1 of the present invention.

FIG. 7 is a diagram showing a manufacturing flow for the mounted structure in accordance with the present preferred embodiment. Next, a non-limiting example of a method for manufacturing the mounted structure 1A according to the present preferred embodiment will be described with reference to FIG. 7.

For the manufacture of the mounted structure 1A in accordance with the present preferred embodiment as described above, first, the above-configured laminated ceramic capacitor 10A and the above-configured wiring substrate 20 are prepared.

Next, as shown in FIG. 7, the solder joint material is supplied to the wiring substrate 20 (step S1). The step S1 is preferably carried out by a screen printing method with the use of stencil (block).

Specifically, a plate stencil provided with a first hole and a second hole corresponding to the first land 22 and second land 23 of the wiring substrate 20 in terms of position and size is prepared in advance, and placed in position on the wiring substrate 20 so that the first hole and second hole respectively have overlaps with the first land 22 and second land 23 of the wiring substrate 20, and the solder joint material is printed so that the first hole and the second hole are filled with the solder joint material. In that regard, the excess solder joint material is scraped with the use of a squeegee or the like so that the solder joint material will not remain on the surface of the stencil. Thus, a predetermined amount of solder joint material is supplied onto the first land 22 and second land 23 of the wiring substrate 20.

It is to be noted that a case of supplying the solder joint material onto the first land 22 and the second land 23 with the use of a screen printing method has been described by way of example in the step S1 described above, the solder joint material may be supplied onto the first land 22 and the second land 23 with the use of other method, or the solder joint material may be supplied onto the second coating portion 14b of the first external electrode 14 of the laminated ceramic capacitor 10A and the seventh coating portion 15b of the second external electrode 15 thereof.

Next, the laminated ceramic capacitor 10A is placed on the wiring substrate 20 (step S2). In the step S2, preferably with the use of a chip mounter, the laminated ceramic capacitor 10A is positioned with a high degree of accuracy, and placed on the wiring substrate 20 so that the second coating portion 14b of the first external electrode 14 of the laminated ceramic capacitor 10A is opposed to the first land 22 of the wiring substrate 20 with the solder joint material as the first joint portion 31 interposed therebetween, and the seventh coating portion 15b of the second external electrode 15 of the laminated ceramic capacitor 10A is opposed to the second land 23 of the wiring substrate 20 with the solder joint material as the second joint portion 32 interposed therebetween.

Next, reflow is carried out (step S3). In the step S3, the laminated ceramic capacitor 10A placed on the wiring substrate 20A with the solder joint material interposed therebetween is put along with the wiring substrate 20 and the solder joint material as a whole into, for example, a reflow furnace. Thus, the solder joint material is heated to be melted, and thereafter cooled to be solidified, thus leading to the formation of the first joint portion 31 and second joint portion 32, and the laminated ceramic capacitor 10A is mounted on the wiring substrate 20.

As just described, the mounted structure 1A shown in FIGS. 5 and 6 is manufactured. It is to be noted that while a case of carrying out so-called reflow soldering with the use of a reflow furnace has been illustrated above as an example, so-called flow soldering may be carried out with the use of a jet-flow solder feeder.

Figure 8:
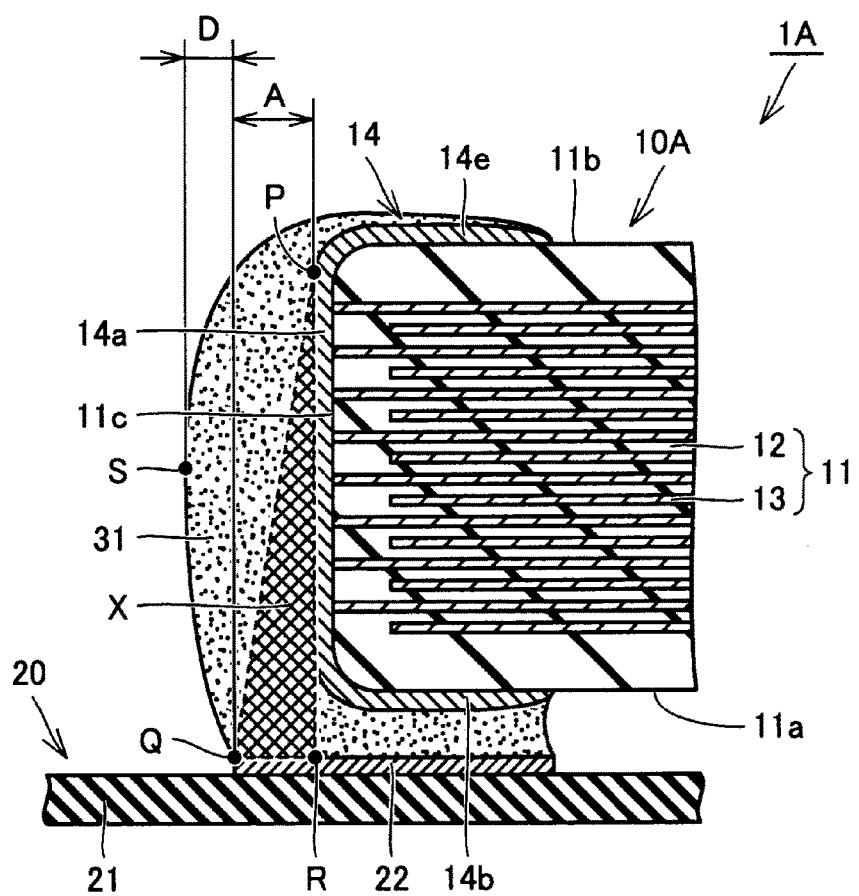
FIG. 8 is an enlarged cross-sectional view of a main portion of the mounted structure shown in FIG. 5.

FIG. 8 is an enlarged cross-sectional view of a main portion of the mounted structure shown in FIG. 5. Next, the characteristic structure of the first joint portion 31 and second joint portion 32, formed by the above-described solder joint material, of the mounted structure 1A in accordance with the present preferred embodiment, and the reason that having this structure makes it possible to significantly reduce or prevent variations in noise will be described with reference to FIG. 8 and FIG. 5 described previously. It is to be noted that while only the first joint portion 31 will be described below in regard to the first joint portion 31 and the second joint portion 32, the same applies to the second joint portion 32.

As shown in FIG. 5, the mounted structure 1A in accordance with the present preferred embodiment is configured such that the distance Lb in the length direction L of the laminated ceramic capacitor 10A from an end of the first land 22 provided on the wiring substrate 20 on the side farther from the second land 23 (the end is referred to as an outer end of the first land 22) to an end of the second land 23 provided thereon on the side farther from the first land 22 is larger than the outer dimension Lc in the length direction L of the laminated ceramic capacitor 10A.

Thus, in the mounted structure 1A in accordance with the present preferred embodiment, as shown in FIG. 8, the outer end of the first land 22 is located outside the outer surface of the first coating portion 14a as a side surface coating portion of the first external electrode 14 in a direction perpendicular or substantially perpendicular to the third surface 11c as the side surface of the laminated ceramic capacitor 10A. More specifically, the distance A shown in FIG. 8 between the outer surface of the first coating portion 14a and the outer end of the first land 22 in a direction perpendicular or substantially perpendicular to the third surface 11c has a positive value when a plane including the outer surface of the first coating portion 14a is considered as a reference plane to determine the distance A as a positive if the outer end of the first land 22 is located outside the reference plane (on the side farther from the laminated ceramic capacitor 10A), or determine the distance A as a negative if the outer end is located inside the reference plane (on the side nearer from the laminated ceramic capacitor 10A).

Furthermore, for the mounted structure 1A in accordance with the present preferred embodiment, the supply of the solder joint material is appropriately adjusted, with the result that after mounting, an end of the first joint portion 31 covering the first coating portion 14a, which is positioned farthest from the third surface 11c of the body 11, that is, an end of the thickest portion (the end is referred to as an outer end portion of the first joint portion 31) is located farther outside the first land 22 in a direction perpendicular or substantially perpendicular to the third surface 11c of body 11. More specifically, the distance D shown in FIG. 8 between the outer end of the first land 22 and the outer end portion of the first joint portion 31 along a direction perpendicular or substantially perpendicular to the third surface 11c has a positive value when a plane including the outer end of the first land 22 and parallel to the third surface 11c is considered as a reference plane to determine the distance D as a positive if the outer end portion of the first joint portion 31 is located outside the reference plane (on the side farther from the laminated ceramic capacitor 10A), or determine the distance D as a negative if the outer end is located inside the reference plane (on the side nearer from the laminated ceramic capacitor 10A).

Trying to restate the shape of the first joint portion 31, the first joint portion 31 can be considered to include a portion that is spaced from the body 11 in a direction perpendicular or substantially perpendicular to the third surface 11c of the body 11 with distance from the outer end of the first land 22 in a direction along the third surface 11c of the body 11.

In this regard, in the cross section shown in FIG. 8, when the position of the outer end of the first land 22 is regarded as a point Q, when the tangent point between a tangent line through the point Q in regard to tangent lines on the outer surface of the first coating portion 14a and the outer surface of the coating portion 14a is regarded as a point P, when the foot of a perpendicular line extending from the point P to the upper surface of the first land 22 is regarded as a point R, and when the position of the outer end portion of the first joint portion 31 is regarded as a point S, a triangle region X with the points P, Q, and R as vertexes serves as a main propagation path for vibrations that can be generated at the third surface 11c of the body 11 in the cross section, and the point S is located outside the region X. It is to be noted that the propagation path for the vibrations is not only the region X, but also formed in the shape of a triangular prism along a direction perpendicular or substantially perpendicular to the cross section shown in FIG. 8 (that is, in the width direction W of the laminated ceramic capacitor 10A).

Therefore, the point S is positioned at a sufficient distance outside the region X, and the first joint portion 31 which is sufficient in size (thickness) is thus located in a position outside the region X (that is, on the side farther from the laminated ceramic capacitor 10A as viewed from the region X).

The adoption of the configuration described above prevents the vibrations generated from varying significantly, even when the solder joint material to serve as the first joint portion 31 varies in the amount of wetting upward, because the variation is absorbed through some changes in the size of a portion of the first joint portion 31 that does not form a propagation path for the vibrations (that is, a portion of the first joint portion 31 located outside the region X). In other words, in wetting upward by the solder joint material, the vibrations generated are prevented from varying significantly, because the variation in the amount of the solder joint material wetting upward is absorbed through some changes in the size of a portion of the first joint portion 31 that widens outwardly with distance from the first land 22, as a portion that does not provide a propagation path for the vibrations.

Accordingly, the mounted structure 1A in accordance with the present preferred embodiment makes it possible to significantly reduce or prevent variations in noise.

Furthermore, through the adoption of the configuration, the above-described portion of the first joint portion 31 does not provide a propagation path for the vibrations will constrain the portion of the first joint portion 31 which forms a propagation path for the vibrations, and the third surface 11c of the body 11 and the first coating portion 14a which coats the third surface 11c, and it is also expected that noise which is generated by vibration of the wiring substrate 20 is significantly reduced or prevented.

Further, the mounted structure 1A in accordance with the present preferred embodiment is configured that the stacking direction (that is, the thickness direction T) of the dielectric layers 12 and internal electrode layers 13 is located to be perpendicular or substantially perpendicular to the main surface of the wiring substrate 20 as described above, and in the thus configured case, as is clear from FIG. 4, the first external electrode 14 and the second external electrode 15 are connected to the first land 22 and the second land 23 with the first joint portion 31 and the second joint portion 32 interposed therebetween, near both ends of the first surface 11a of the body 11 in the length direction L, which are portions with relatively small distortion. Thus, also in this respect, the mounted structure 1A is advantageously configured from the perspective of significantly reducing or preventing the generation of vibrations.

Preferred Embodiment 2

Figure 9:
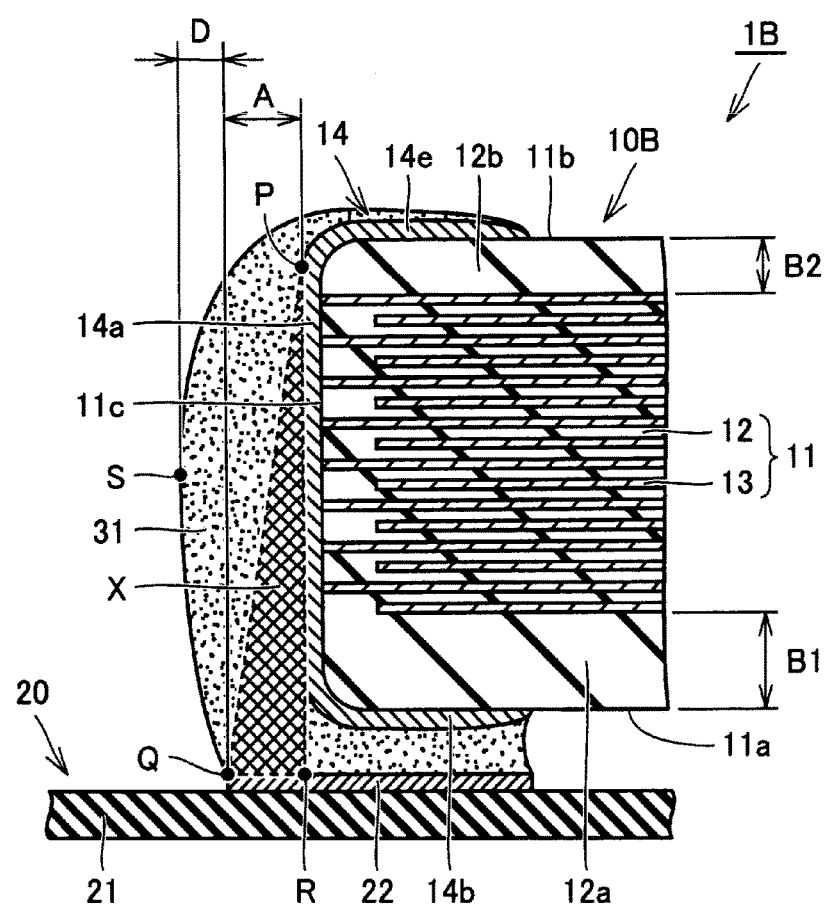
FIG. 9 is an enlarged cross-sectional view of a main portion of the mounted structure in accordance with Preferred Embodiment 2 of the present invention.

FIG. 9 is an enlarged cross-sectional view of a main portion of a mounted structure in accordance with Preferred Embodiment 2 of the present invention. The mounted structure 1B in accordance with the present preferred Embodiment will be described below with reference to FIG. 9.

As shown in FIG. 9, the mounted structure 1B in accordance with the present preferred embodiment differs from the mounted structure 1A in accordance with Preferred Embodiment 1 as described above, only in the configuration of a laminated ceramic capacitor 10B mounted on a wiring substrate 20.

Specifically, the laminated ceramic capacitor 10B differs in configuration from the laminated ceramic capacitor 10A provided for the mounted structure 1A in accordance with Preferred Embodiment 1 as described above, in that in regard to the dielectric layers 12 included within a body 11, the thickness B1 of a dielectric layer 12a on the first principal surface side, which is a dielectric layer that defines a first surface 11a as a first principal surface of the body 11, is larger than the thickness B2 of a dielectric layer 12b on the second principal surface side, which is a dielectric layer that defines a second surface 11b as a second principal surface of the body 11. In the case of the thus configured laminated ceramic capacitor 10B, a capacitance portion that exhibits piezoelectricity and electrostriction to serve as a vibration source is located farther from the first surface 11a of the body 11.

Therefore, with the laminated ceramic capacitor 10B mounted on the wiring substrate 20 so that the first surface 11a located farther from the capacitance portion is opposed to the main surface of the wiring substrate 20 as in the present preferred embodiment, the vibrations propagated from the capacitance portion to the wiring substrate 20 will be attenuated more effectively, and the combination with the effect described above in Preferred Embodiment 1 thus makes it possible to further effectively reduce or prevent noise generation and variations in noise.

Preferred Embodiment 3

Figure 10:
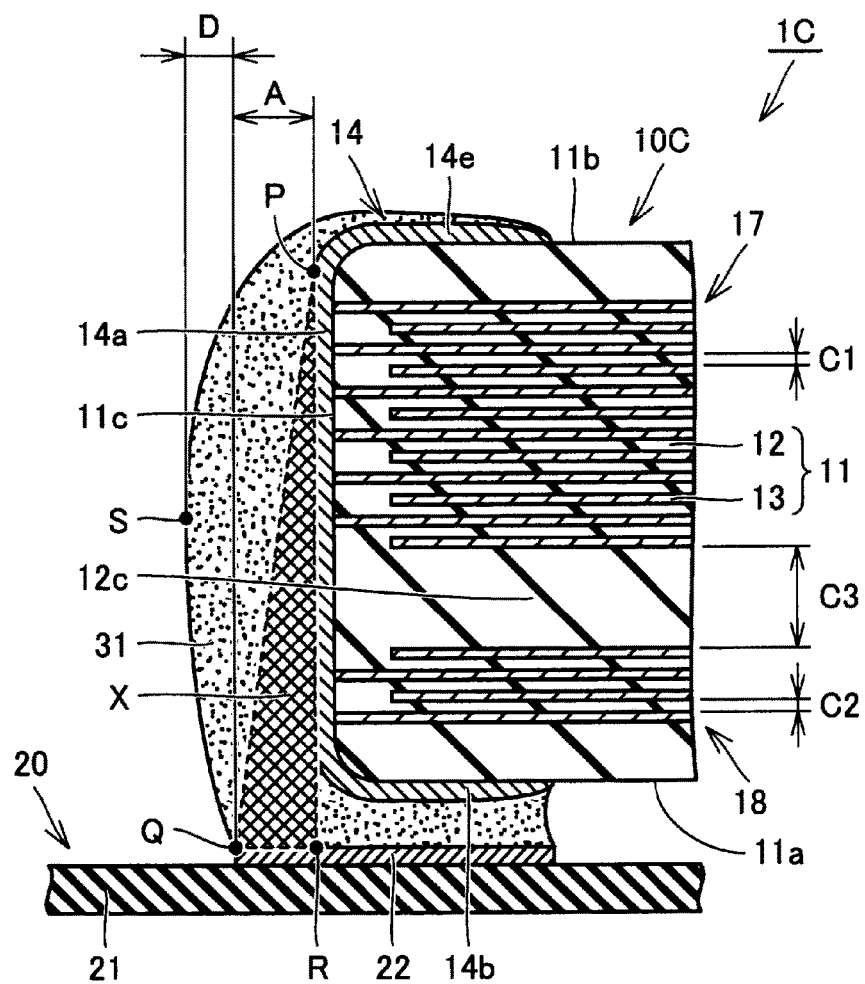
FIG. 10 is an enlarged cross-sectional view of a main portion of a mounted structure in accordance with Preferred Embodiment 3 of the present invention.

FIG. 10 is an enlarged cross-sectional view of a main portion of a mounted structure in accordance with Preferred Embodiment 3 of the present invention. The mounted structure 1C in accordance with the present preferred embodiment will be described below with reference to FIG. 10.

As shown in FIG. 10, the mounted structure 1C in accordance with the present preferred embodiment differs from the mounted structure 1A in accordance with Preferred Embodiment 1 as described above, only in the configuration of a laminated ceramic capacitor 10C mounted on a wiring substrate 20.

Specifically, the laminated ceramic capacitor 10C differs in configuration from the laminated ceramic capacitor 10A provided for the mounted structure 1A in accordance with Preferred Embodiment 1 as described above, in that a capacitance portion generated within a body 11 is separated by a dielectric layer 12c that generates no capacitance in the stacking direction (that is, the thickness direction T) of the dielectric layers 12 and internal electrode layers 13 to include two capacitance portions of a first capacitance portion 17 and a second capacitance portion 18.

The first capacitance portion 17 is located between a second surface 11b that is a second principal surface of the body 11 and the second capacitance portion 18.

In addition, the total number of the internal electrode layers 13 included in the first capacitance portion 17 is larger than the total number of the internal electrode layers 13 included in the second capacitance portion 18, and the total thickness of the first capacitance portion 17 is thus larger than the total thickness of the second capacitance portion 18. This means that the capacitance generated by the first capacitance portion 17 is higher than the capacitance generated by the second capacitance 18.

In this regard, the thickness C3 of the dielectric layer 12c is larger than any of spacing C1 in the stacking direction of the internal electrode layers 13 included in the first capacitance portion 17 and spacing C2 in the stacking direction of the internal electrode layers 13 included in the second capacitance portion 18. This means that, as described above, the first capacitance portion 17 and the second capacitance portion 18 are separated in the stacking direction of the dielectric layers 12 and internal electrode layers 13.

In the thus configured laminated ceramic capacitor 10C, the first capacitance portion 17 which serves as a main vibration source is located farther from a first surface 11a of the body 11, whereas the second capacitance portion 18 which serves as a relatively minor vibration source, but not a main vibration source, is located closer to the first surface 11a of the body 11.

In this regard, the second capacitance portion 18 is intended to narrow the loop area of a circuit through which electric current flows (that is, a circuit defined by a current pathway provided in the laminated ceramic capacitor 10C and a current pathway provided in the wiring substrate 20), and providing the second capacitance portion 18 in a position closer to the wiring substrate 20 within the body 11 makes it possible to reduce ESL (equivalent series inductance) of the laminated ceramic capacitor 10C as a parasitic component.

Therefore, as in the present preferred embodiment, when the laminated ceramic capacitor 10C is mounted on the wiring substrate 20 so that the first surface 11a located farther from the first capacitance portion 17 to serve as a main vibration source and located closer to the second capacitance portion 18 to serve as a relatively minor vibration source, but not a main vibration source, is opposed to the main surface of the wiring substrate 20, the vibrations propagated from the first capacitance portion 17 to the wiring substrate 20 will be attenuated more effectively, and the loop area of the circuit through which electric current flows will be narrowed due to the presence of the second capacitance portion 18. Thus, the combination with the effect described above in Preferred Embodiment 1 makes it possible to further effectively reduce or prevent noise generation and variations in noise, and can achieve reduced ESL while ensuring high capacitance.

Preferred Embodiment 4

Figure 11:
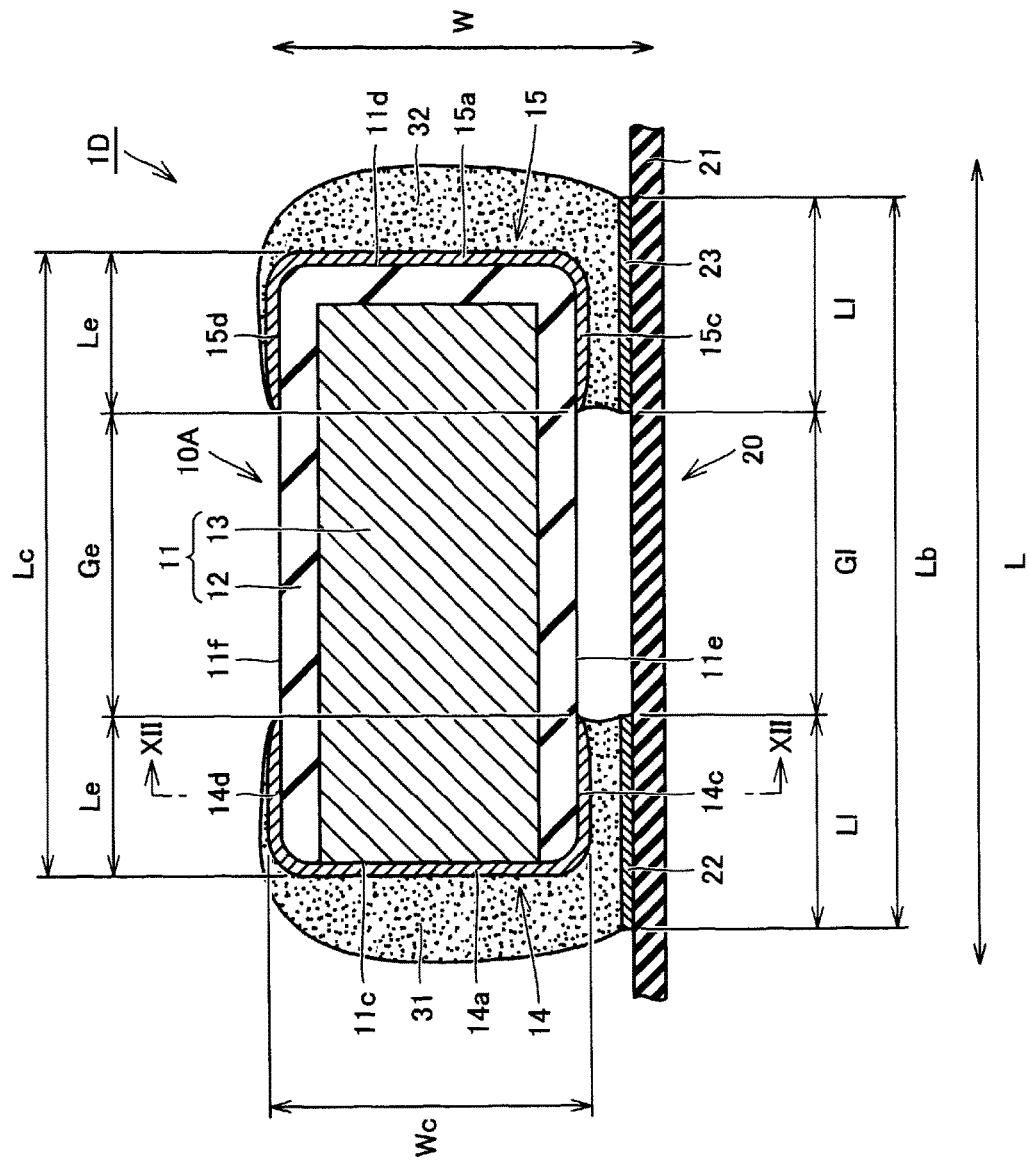
FIG. 11 is a schematic cross-sectional view of a mounted structure in accordance with Preferred Embodiment 4 of the present invention.
Figure 12:
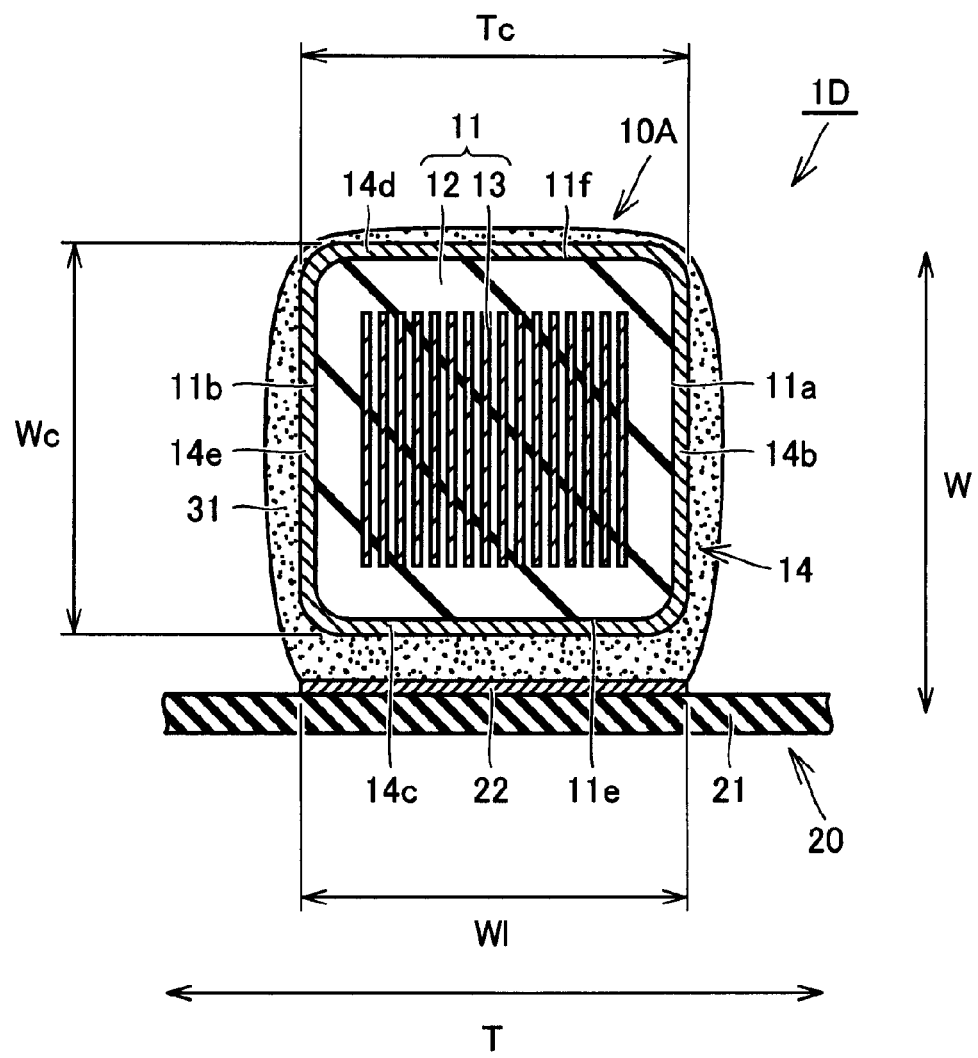
FIG. 12 is a schematic cross-sectional view along the line XII-XII shown in FIG. 11.

FIG. 11 is a schematic cross-sectional view of a mounted structure in accordance with Preferred Embodiment 4 of the present invention, and FIG. 12 is a schematic cross-sectional view along the line XII-XII shown in FIG. 11. In this regard, FIG. 11 shows a cross section of a laminated ceramic capacitor 10A in a middle position in the thickness direction T. First, the mounted structure 1D in accordance with the present preferred embodiment will be described with reference to FIGS. 11 and 12.

As shown in FIGS. 11 and 12, the mounted structure 1D in accordance with the present preferred embodiment includes the laminated ceramic capacitor 10A configured in the same fashion as the laminated ceramic capacitor 10A mounted for the mounted structure 1A in accordance with Preferred Embodiment 1 as described above, but differs in the orientation with respect to the wiring substrate 20 from in the case of the mounted structure 1A in accordance with Preferred embodiment 1 as described above.

Specifically, in the mounted structure 1D in accordance with the present preferred embodiment, the laminated ceramic capacitor 10A is placed with a fifth surface 11e of a body 11 opposed to the main surface of the wiring substrate 20 so that a third coating portion 14c of a first external electrode 14 is opposed to a first land 22 of the wiring substrate 20, and an eighth coating portion 15c of a second external electrode 15 is opposed to a second land 23 of the wiring substrate 20.

A first joint portion 31 joins the first external electrode 14 and first land 22 placed to be opposed, adheres to the outer surface of the first land 22, and adheres to the outer surface of the first external electrode 14 continuously on the first coating portion 14a, second coating portion 14b, third coating portion 14c, fourth coating portion 14d, and fifth coating portion 14e of the first external electrode 14.

Furthermore, a second joint portion 32 joins the second external electrode 15 and second land 23 placed to be opposed, adheres to the outer surface of the second land 23, and adheres to the outer surface of the second external electrode 15 continuously on the sixth coating portion 15a, seventh coating portion (not shown in FIGS. 11 and 12), eighth coating portion 15c, ninth coating portion 15d, and tenth coating portion (not shown in FIGS. 11 and 12) of the second external electrode 15.

In the mounted structure 1D configured as mentioned above in accordance with the present preferred embodiment, the fifth surface 11e of the body 11 of the laminated ceramic capacitor 10A corresponds to a first principal surface opposed to the main surface of the wiring substrate 20, whereas the sixth surface 11f of the body 11 of the laminated ceramic capacitor 10A corresponds to a second principal surface. Furthermore, the third surface 11c and fourth surface 11d of the body 11 of the laminated ceramic capacitor 10A respectively correspond to the side surfaces of the body 11, which are coated with the first external electrode 14 and the second external electrode 15, and the first coating portion 14a of the first external electrode 14 and the sixth coating portion 15a of the second external electrode 15 respectively correspond to side surface coating portions that coat the side surfaces of the body 11.

Furthermore, thus, in the mounted structure 1D in accordance with the present preferred embodiment, the stacking direction (that is, the thickness direction T) of the dielectric layers 12 and internal electrode layers 13 included in the body 11 is located parallel to the main surface of the wiring substrate 20.

Figure 13:
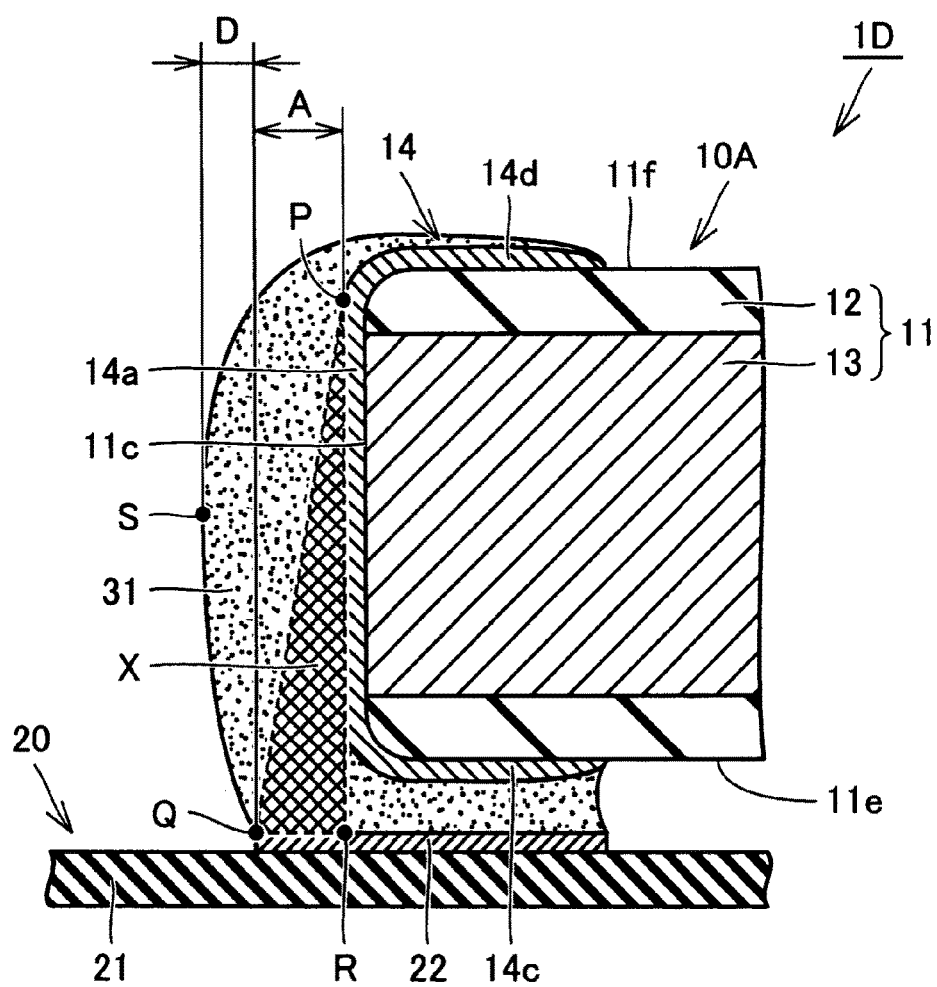
FIG. 13 is an enlarged cross-sectional view of a main portion of the mounted structure shown in FIG. 11.

FIG. 13 is an enlarged cross-sectional view of a main portion of the mounted structure shown in FIG. 11. Next, a more detailed structure near the first joint portion 31 of the mounted structure 1D in accordance with the present preferred embodiment will be described with reference to FIG. 13. It is to be noted that while the detailed description will be skipped, the structure near the second joint portion 32 is also the same as the structure near the first joint portion 31 as described below.

As shown in FIG. 13, also in the mounted structure 1D in accordance with the present preferred embodiment, the outer end of the first land 22 is located outside the outer surface of the first coating portion 14a as a side surface coating portion of the first external electrode 14 in a direction perpendicular or substantially perpendicular to the third surface 11c as the side surface of the laminated ceramic capacitor 10A, as in the case of the mounted structure 1A in accordance with Preferred Embodiment 1 as described above.

Furthermore, also for the mounted structure 1D in accordance with the present preferred embodiment, the supply of the solder joint material is appropriately adjusted, with the result that after mounting, an outer end portion of the first joint portion 31 covering the first coating portion 14a, which is positioned farthest from the third surface 11c of the body 11, is located farther outside the first land 22 in a direction perpendicular or substantially perpendicular to the third surface 11c of body 11, as in the case of the mounted structure 1A in accordance with Preferred Embodiment 1 as described above.

Trying to restate the shape of the first joint portion 31, the first joint portion 31 can be considered to include a portion that is spaced from the body 11 in a direction perpendicular or substantially perpendicular to the third surface 11c of the body 11 with distance from the outer end of the first land 22 in a direction along the third surface 11c of the body 11.

In this regard, in the cross section shown in FIG. 13, when the position of the upper end of the outer surface of the first coating portion 14a is regarded as a point P, when the position of the outer end of the first land 22 is regarded as a point Q, when the foot of a perpendicular line extending from the point P to the upper surface of the first land 22 is regarded as a point R, and when the position of the outer end portion of the first joint portion 31 is regarded as a point S, a triangle region X with the points P, Q, and R as vertexes serves as a main propagation path for vibrations that can be generated at the third surface 11c of the body 11 in the cross section, and the point S is located outside the region X. It is to be noted that the propagation path for the vibrations is not only the region X, but also formed in the shape of a triangular prism in a direction perpendicular or substantially perpendicular to the cross section shown in FIG. 13 (that is, in the thickness direction T of the laminated ceramic capacitor 10A).

Therefore, the point S is positioned at a sufficient distance outside the region X, and the first joint portion 31 which is sufficient in size (thickness) is thus formed in a position outside the region X (that is, on the side farther from the laminated ceramic capacitor 10A as viewed from the region X).

The adoption of the configuration described above prevents the vibrations generated from varying significantly, even when the solder joint material to serve as the first joint portion 31 varies in the amount of wetting upward, because the variation is absorbed through some changes in the size of a portion of the first joint portion 31 which does not provide a propagation path for the vibrations (that is, a portion of the first joint portion 31 located outside the region X). In other words, in wetting upward by the solder joint material, the variations generated are prevented from varying significantly, because the variation in the amount of the solder joint material wetting upward is absorbed through some changes in the size of a portion of the first joint portion 31 that widens outwardly with distance from the first land 22, as a portion that does not provide a propagation path for the vibrations.

Accordingly, the mounted structure 1D in accordance with the present preferred embodiment makes it possible to significantly reduce or prevent variations in noise.

Furthermore, through the adoption of the configuration, the above-described portion of the first joint portion 31 which does not provide a propagation path for the vibrations will constrain the portion of the first joint portion 31 which forms a propagation path for the vibrations, and the third surface 11c of the body 11 and the first coating portion 14a which coats the third surface 11c, and it is also expected that noise which is generated by vibration of the wiring substrate 20 is significantly reduced or prevented.

Preferred Embodiment 5

Figure 14:
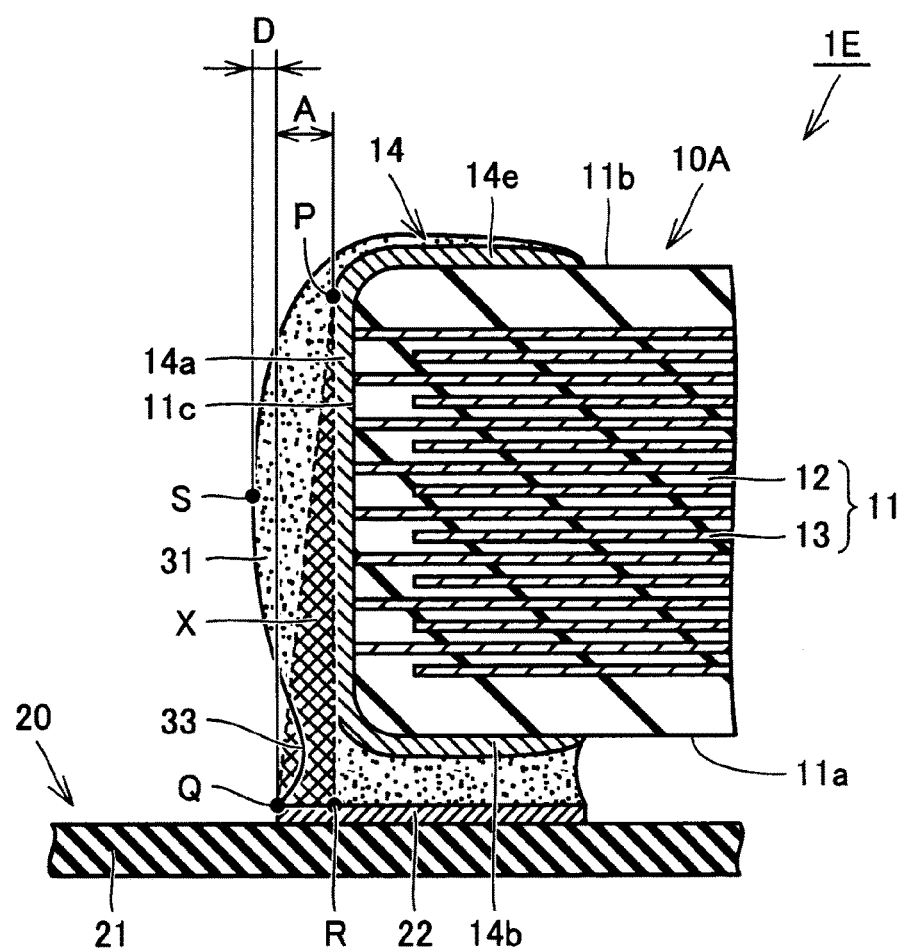
FIG. 14 is an enlarged cross-sectional view of a main portion of a mounted structure in accordance with Preferred Embodiment 5 of the present invention.

FIG. 14 is an enlarged cross-sectional view of a main portion of a mounted structure in accordance with Preferred Embodiment 5 of the present invention. The mounted structure 1E in accordance with the present preferred embodiment will be described below with reference to FIG. 14. It is to be noted that while the detailed description will be skipped, the structure near the second joint portion 32 is also the same as the structure near the first joint portion 31 as described below.

As shown in FIG. 14, the mounted structure 1E in accordance with the present preferred embodiment differs in that the distance Lb along the length direction L of the laminated ceramic capacitor 10A from an end of the first land 22 provided on the wiring substrate 20 on the side farther from the second land 23 (that is, an outer end of the first land 22) to an end of the second land 23 provided thereon on the side farther from the first land 22 is set closer in magnitude to the outer dimension Lc in the length direction of the laminated ceramic capacitor 10A, as compared with the mounted structure 1A in accordance with Preferred Embodiment 1 as described above. However, also in the mounted structure 1E in accordance with the present preferred embodiment, the distance A along a direction perpendicular or substantially perpendicular to the third surface 11c between the outer surface of the first coating portion 14a and the outer end of the first land 22 has a positive value as shown in FIG. 14.

Furthermore, also for the mounted structure 1E in accordance with the present preferred embodiment, the supply of the solder joint material is appropriately adjusted, with the result that after mounting, the outer end portion of the first joint portion 31 is located farther outside the outer end of the first land 22 in a direction perpendicular or substantially perpendicular to the third surface 11c of body 11, as in the case of the mounted structure 1A in accordance with Preferred Embodiment 1 as described above.

In the mounted structure 1E in accordance with the present preferred embodiment, the supply of the solder joint material is appropriately adjusted, with the result that the first joint portion 31 has a constricted portion 33 provided at the surface located between the outer end portion of the first joint portion 31 and the outer end of the first land 22. The constricted portion 33 is produced mainly due to the surface tension when the melted solder joint material spreads with wettability, and formed with more solder joint material accumulated on a central portion of the first coating portion 14a as a side surface coating portion of the first external electrode 14.

Trying to restate the shape of the first joint portion 31, the first joint portion 31 includes a portion spaced from the body 11 in a direction perpendicular or substantially perpendicular to the third surface 11c of the body 11 with distance from the outer end of the first land 22 in a direction along the third surface 11c of the body 11, and more specifically, the first joint portion 31 can be considered spaced from the body 11 in a direction perpendicular or substantially perpendicular to the third surface 11c of the body 11, from the constricted portion 33 toward the outer end portion (to spread outwardly from the constricted portion 33 to the outer end portion).

In this regard, in the cross section shown in FIG. 14, when the position of the upper end of the outer surface of the first coating portion 14a is regarded as a point P, when the position of the outer end of the first land 22 is regarded as a point Q, when the foot of a perpendicular line extending from the point P to the upper surface of the first land 22 is regarded as a point R, and when the position of the outer end portion of the first joint portion 31 is regarded as a point S, a triangle region X with the points P, Q, and R as vertexes serves as a main propagation path for vibrations that can be generated at the third surface 11c of the body 11 in the cross section, the point S is located outside the region X, and the above-described constricted portion 33 is configured so as to have an overlap with the region X.

Therefore, the constricted portion 33 is provided so as to have an overlap with a propagation path for the vibrations, thus partially blocking the propagation path for the vibrations, and thus resulting in reduced propagation of the vibrations to the wiring substrate 20. Accordingly, the adoption of the configuration significantly reduces or prevents noise generation due to the vibration of the wiring substrate 20 to a great degree.

Accordingly, as in the present preferred embodiment, with the constricted portion 33 provided so as to have an overlap with the propagation path for the vibrations formed by the solder joint material, the combination with the effect described above in Preferred Embodiment 1 makes it possible to further effectively significantly reduce or prevent noise generation and variations in noise.

It is to be noted that the constricted portion 33 is, as shown, preferably located on the side closer to the first surface 11a than the internal electrode layer in the closest position to the first surface 11a as a first principal surface of the body 11, among the internal electrode layers 13 included within the body 11. This configuration makes it possible to further ensure that the propagation path for the vibrations is blocked by the constricted portion 33, and the significant reduction or prevention of noise generation is thus further ensured.

Preferred Embodiment 6

Figure 15:
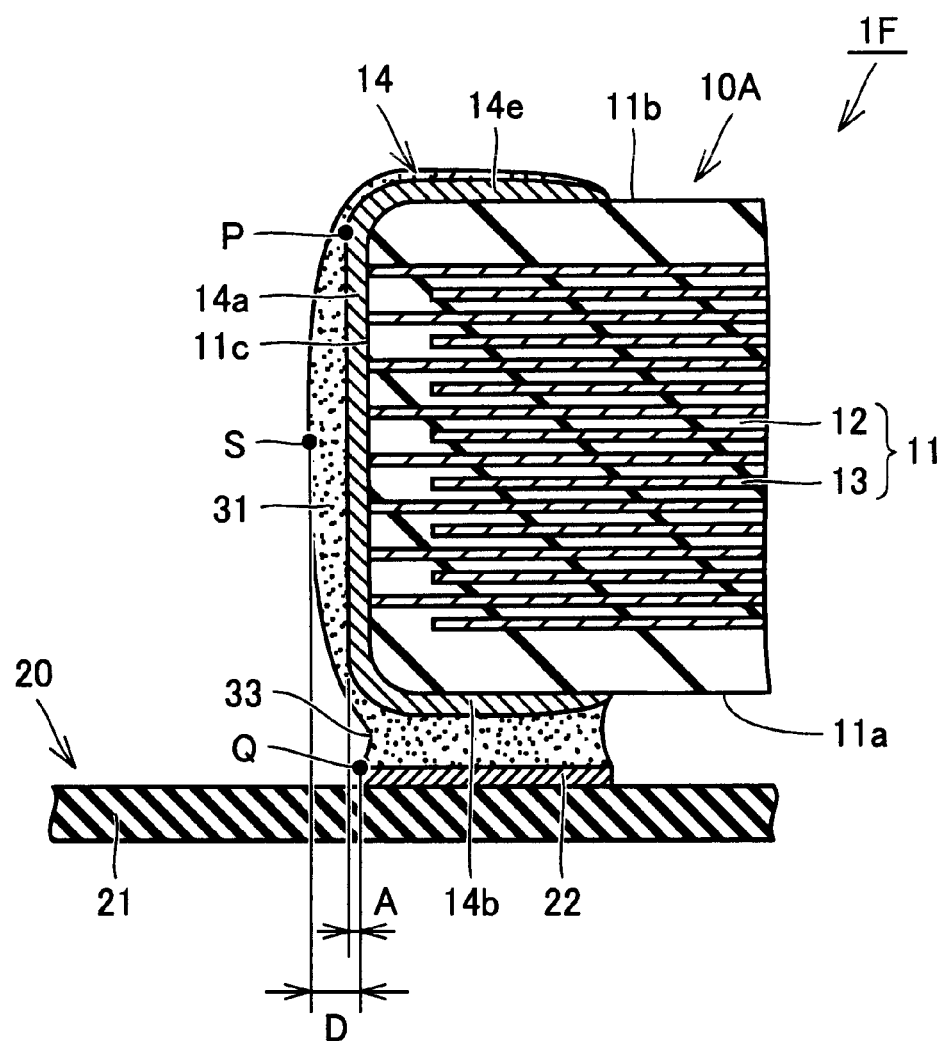
FIG. 15 is an enlarged cross-sectional view of a main portion of a mounted structure in accordance with Preferred Embodiment 6 of the present invention.

FIG. 15 is an enlarged cross-sectional view of a main portion of a mounted structure in accordance with Preferred Embodiment 6 of the present invention. The mounted structure 1F in accordance with the present preferred embodiment will be described below with reference to FIG. 15. It is to be noted that while the detailed description will be skipped, the structure near a second joint portion 32 is also the same as the structure near a first joint portion 31 as described below.

As shown in FIG. 15, the mounted structure 1F in accordance with the present preferred embodiment differs in that the distance Lb along the length direction L of a laminated ceramic capacitor 10A from an end of a first land 22 provided on the wiring substrate 20 on the side farther from a second land 23 (that is, an outer end of the first land 22) to an end of the second land 23 provided thereon on the side farther from the first land 22 is set to be smaller than the outer dimension Lc in the length direction of the laminated ceramic capacitor 10A, as compared with the mounted structure 1A in accordance with Preferred Embodiment 1 as described above.

Thus, in the mounted structure 1F in accordance with the present preferred embodiment, as shown in FIG. 15, the outer end of the first land 22 is located inside the outer surface of a first coating portion 14a as a side surface coating portion of a first external electrode 14 in a direction perpendicular or substantially perpendicular to a third surface 11c as a side surface of the laminated ceramic capacitor 10A. More specifically, the distance A shown in FIG. 15 between the outer surface of the first coating portion 14a and the outer end of the first land 22 along a direction perpendicular or substantially perpendicular to the third surface 11c has a negative value when a plane including the outer surface of the first coating portion 14a is considered as a reference plane to determine the distance A as a positive if the outer end of the first land 22 is located outside the reference plane (on the side farther from the laminated ceramic capacitor 10A), or determine the distance A as a negative if the outer end is located inside the reference plane (on the side nearer from the laminated ceramic capacitor 10A).

On the other hand, also for the mounted structure 1F in accordance with the present preferred embodiment, the supply of the solder joint material is appropriately adjusted, with the result that after mounting, the outer end portion of the first joint portion 31 is located farther outside the outer end of the first land 22 in a direction perpendicular or substantially perpendicular to the third surface 11c of body 11, as in the case of the mounted structure 1A in accordance with Preferred Embodiment 1 as described above.

Trying to restate the shape of the first joint portion 31, the first joint portion 31 can be considered to include a portion that is spaced from the body 11 in a direction perpendicular or substantially perpendicular to the third surface 11c of the body 11 with distance from the outer end of the first land 22 in a direction along the third surface 11c of the body 11.

In this regard, in the cross section shown in FIG. 15, when the position of the upper end of the outer surface of the first coating portion 14a is regarded as a point P, when the position of the outer end of the first land 22 is regarded as a point Q, and when the position of the outer end portion of the first joint portion 31 is regarded as a point S, the point S is located outside the segment PQ, and the segment PQ is blocked by the first coating portion 14a of the first external electrode 14.

Therefore, the main propagation path for vibrations that can be generated at the third surface 11c of the body 11 is never located in the cross section, and as a result, the propagation of the vibrations to the wiring substrate 20 is reduced significantly. Accordingly, the adoption of the configuration significantly reduces or prevents noise generation due to the vibration of the wiring substrate 20 more effectively.

Furthermore, the adoption of the configuration described above prevents the vibrations generated from varying significantly, even when the solder joint material to serve as the first joint portion 31 varies in the amount of wetting upward, because the variation is absorbed through some changes in the size of a portion of the first joint portion 31 that covers the first coating portion 14a, which is a portion that does not provide a propagation path for the vibration. In other words, in wetting upward by the solder joint material, the vibrations generated are prevented from varying significantly, because the variation in the amount of the solder joint material wetting upward is absorbed through some changes in the size of a portion of the first joint portion 31 that widens outwardly with distance from the first land 22, as a portion that does not provide a propagation path for the vibrations.

Accordingly, the mounted structure 1F in accordance with the present preferred embodiment makes it possible to significantly reduce or prevent variations in noise.

In addition, as shown, in this case, it is also possible to provide the constricted portion 33 as described above in Preferred Embodiment 5 at the surface of the first joint portion 31 sandwiched by the first external electrode 14 and the first land 22, by appropriately adjusting the supply of the solder joint material.

Trying to restate the shape of the first joint portion 31, the first joint portion 31 includes a portion spaced from the body 11 in a direction perpendicular or substantially perpendicular to the third surface 11c of the body 11 with distance from the outer end of the first land 22 in a direction along the third surface 11c of the body 11, and more specifically, the first joint portion 31 can be considered spaced from the body 11 in a direction perpendicular or substantially perpendicular to the third surface 11c of the body 11, from the constricted portion 33 toward the outer end portion (to spread outwardly from the constricted portion 33 to the outer end portion).

This configuration makes it possible to significantly reduce or prevent noise generation more effectively, because the main propagation path for vibrations that can be generated at the first surface 11a of the body 11 is partially blocked by the constricted portion 33.

It is to be noted that while a case in which the outer end of the first land 22 is located inside the outer surface of the first coating portion 14a of the first external electrode 14 in a direction perpendicular or substantially perpendicular to the third surface 11c of the laminated ceramic capacitor 10A has been provided by way of example in the present preferred embodiment, the same effect is achieved even when the outer end of the first land 22 is placed in the same position as the outer surface of the first coating portion 14a of the first external electrode 14 in the direction.

Verification Test

A verification test will be described below in which a number of preproduction samples was actually made in accordance with the mounted structure 1F according to Preferred Embodiment 6 which is considered more advantageous for the reduction or prevention of noise generation among the various preferred embodiments described above, and checked for how variations in noise are significantly reduced or prevented and how noise generation is reduced or prevented.

Figure 16:
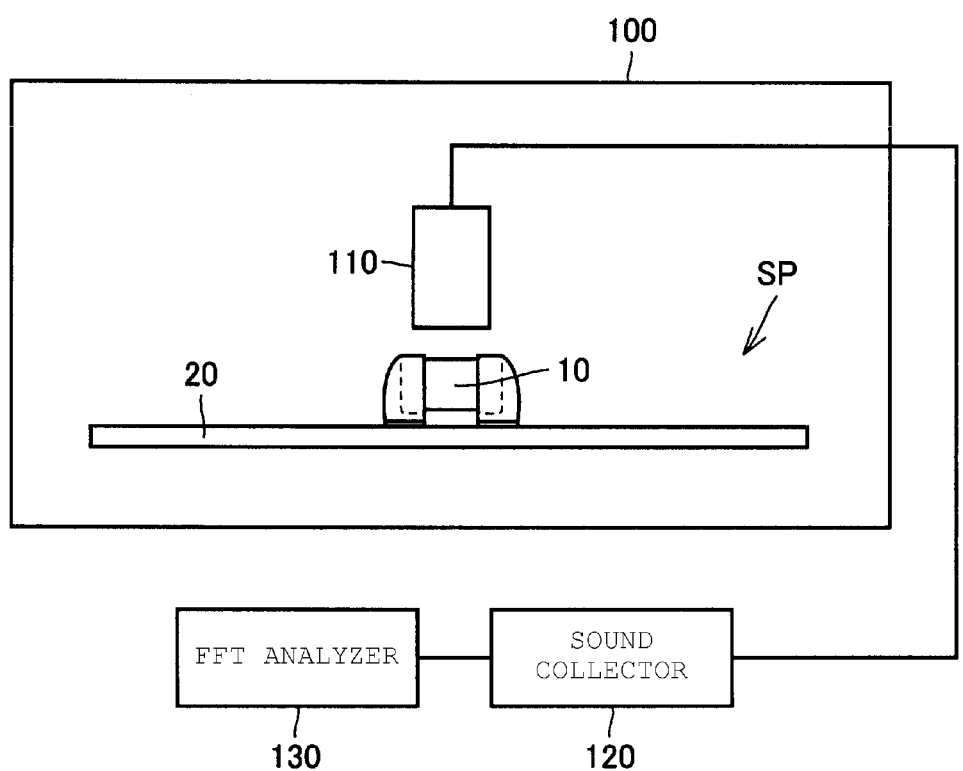
FIG. 16 is a schematic diagram illustrating a method for measuring the sound pressure of noise in a verification test.
Figure 18:
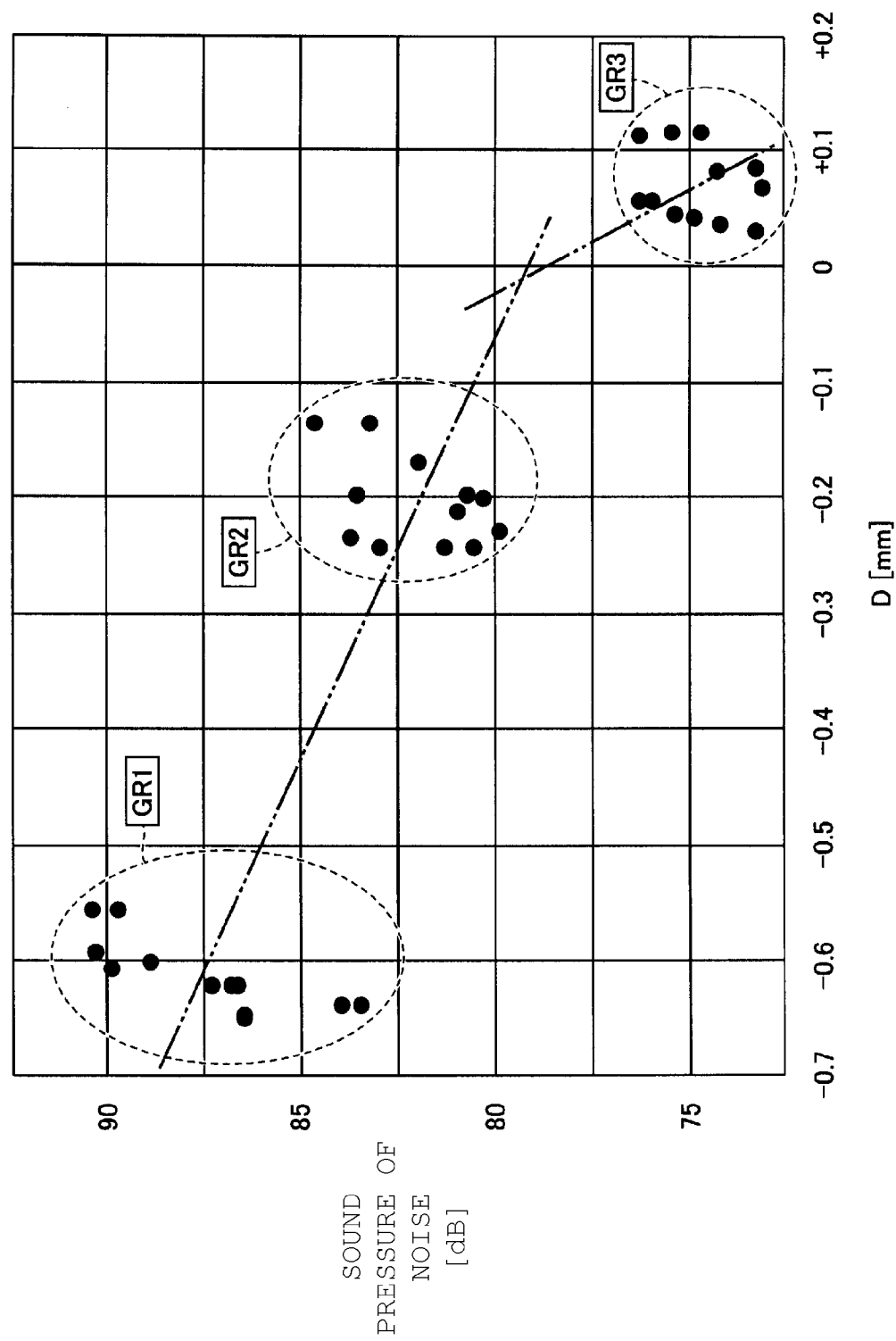
FIG. 18 is a graph of the further structured test results of Verification Examples 1 to 3 in the verification test.

FIG. 16 is a schematic diagram illustrating a method for measuring the sound pressure of noise in the present verification test. In addition, FIG. 17 is a table showing manufacturing conditions and test results of Verification Examples 1 to 3 in the present verification test, FIG. 18 is a graph of the further structured test results of Verification Examples 1 to 3 in the present verification test.

As shown in FIG. 16, in the actually measuring sound pressure of noise, a sample SP was placed in an anechoic box 100, and in this condition, a direct-current voltage of 3.7 V and an alternating-current voltage of 1.0 Vpp within a frequency band of 1.5 kHz to 20 kHz were applied to the laminated ceramic capacitor 10 mounted on the wiring substrate 20 to measure the total sound pressure level of noise generated in that case.

It is to be noted that the total sound pressure level of the noise is measured by placing a sound collecting microphone 110 to be opposed in a position 3 mm above the laminated ceramic capacitor 10 included in the sample SP in the anechoic box 100, collecting sound generated from the sample SP with the sound collecting microphone 110 and a sound collector 120, and analyzing the collected sound with the use of a FFT analyzer 130 (CF-5220 from Ono Sokki Co., Ltd.).

In the present verification test, laminated ceramic capacitors with the dimensions shown in FIG. 17 and wiring substrates with the various dimensions shown in FIG. 17 were each prepared as more than one capacitor or substrate, and the laminated ceramic capacitor was mounted on the wiring substrate while varying the aperture volume of stencil corresponding to the supply of a solder paste to four levels of the first to fourth levels shown in FIG. 17. Specifically, a method was adopted in which more than one type of stencil was prepared to vary the thicknesses of the stencils from each other while holes for supplying the solder paste, provided in the stencils, were set to have the same aperture area.

As shown in FIG. 17, the laminated ceramic capacitors of the same specification were used in all of Verification Examples 1 to 3. The material of the dielectric material constituting the body of the laminated ceramic capacitor contains barium titanate as its main constituent, the number of the internal electrode layers included in the body is 525 in total, the interval between the internal electrode layers is approximately 0.91 μm, and the capacitance is 22 μF.

On the other hand, in Verification Examples 1 to 3, used were the wiring substrates differing from each other in the distance Lb (see FIG. 5 and the like) between the outer ends of a pair of lands: the wiring substrate of 3 mm in distance Lb was used in Verification Example 1; the wiring substrate of 2.2 mm in distance Lb was used in Verification Example 2; and the wiring substrate of 1.72 mm in distance Lb was used in Verification Example 3.

Further, the number of samples for each level in Verification Examples 1 to 3 was made three to make twelve types of thirty-six samples of mounted structure in total, and for all of the samples, the sound pressure of the noise was measured, and the distance D (see FIGS. 8, 14, and 15) along the length direction L of the laminated ceramic capacitor was actually measured between the outer end of the first land and the outer end portion of the joint portion as described above.

As shown in FIG. 17, the average value on the sound pressure of the actually measured noise, including all of the levels, was 87.5 dB in Verification Example 1, 81.9 dB in Verification Example 2, and 74.7 dB in Verification Example 3. In addition, the CV value on the sound pressure of the actually measured noise, including all of the levels, was 2.7% in Verification Example 1, 1.93% in Verification Example 2, and 1.54% in Verification Example 3. In this regard, the CV value is referred to as a variation coefficient, which is a value obtained by dividing the standard deviation by the arithmetic mean, and an index indicating the relative degree of variability. More specifically, it is indicated the variability is relatively large when the CV value is large, whereas it is indicated the variability is relatively small when the CV value is small.

On the other hand, as shown in FIG. 18, the relationship between the sound pressure of the actually measured noise and the distance D was as in the graph shown in FIG. 18. In this regard, as shown in FIG. 18, respective points that show the relationship between the sound pressure of the actually measured noise and the distance D can be roughly divided into three groups, and among these groups, the first group GR1 includes only the respective samples in Verification Example 1 as mentioned above, the second group GR2 includes only the respective samples in Verification Example 2 as mentioned above, and the third group GR3 includes only the respective samples in Verification Example 3 as mentioned above.

Referring to FIG. 18, it can be understood that in the case of the samples included in the first group GR1 and the second group GR2, the distance D has a negative value (that is, the outer end portion of a portion of the joint portion covering a side surface coating portion of the external electrode is located inside the outer end of the land in a direction perpendicular or substantially perpendicular to the side surface of the body), and in that case, the sound pressure of the noise is gradually reduced as the distance D has a value closer to 0 (that is, the sound pressure of the noise is approximately 83 dB to 91 dB in the case of the samples included in the first group GR1, and the sound pressure of the noise is approximately 80 dB to 85 dB in the case of the samples included in the second group GR2). Furthermore, it can be understood that the variability in sound pressure of noise in that case is also gradually reduced as the distance D has a value closer to 0.

On the other hand, it can be understood that in the case of the samples included in the third group GR3, the distance D has a positive value (that is, the outer end portion of a portion of the joint portion covering a side surface coating portion of the external electrode is located farther outside the outer end of the land in a direction perpendicular or substantially perpendicular to the side surface of the body), and in that case, the sound pressure of the noise is reduced significantly as compared with the samples included in the first group GR1 and the second group GR2 (that is, the sound pressure of the noise is approximately 73 dB to 77 dB in the case of the samples included in the third group GR3). Furthermore, it can be understood that the variability in sound pressure of noise in that case is also reduced as compared with the samples included in the first group GR1 and the second group GR2.

As just described, also from the results of the present verification test, it has been confirmed that the adoption of the configuration as in Preferred Embodiment 6 as described above effectively significantly reduces or prevents variations in noise, and also suppresses the level of the noise.

While cases of mounting the laminated ceramic capacitor onto the wiring substrate with the use of the solder joint material as a joint material have been described by way of examples in Preferred Embodiments 1 to 6 of the present invention as described above, the joint material is not limited thereto, but it is possible to use various types of brazing filler metals similar to the solder joint material.

Furthermore, while cases of applying the joint structure according to various preferred embodiments of the present invention to both of a pair of external electrodes of the laminated ceramic capacitor provided with the pair of external electrodes have been described by way of examples in Preferred Embodiments 1 to 6 of the present invention as described above, a corresponding effect is achieved even when the joint structure according to various preferred embodiments of the present invention is applied to only one of the pair of external electrodes.

Furthermore, while cases of mounting the laminated ceramic capacitor provided with a pair of external electrodes onto the wiring substrate have been described by way of examples in Preferred Embodiments 1 to 6 of the present invention as described above, it is also naturally possible to apply various preferred embodiments of the present invention to laminated ceramic capacitors provided with three or more external electrodes, and in that case, a corresponding effect is achieved by applying the joint structure according to various preferred embodiments of the present invention to at least one of the external electrodes.

Furthermore, while cases in which the side surfaces of the body covered with the external electrodes are each planar have been described by way of examples in Preferred Embodiments 1 to 6 of the present invention as described above, the side surfaces do not necessarily have to be planar, but may be curved.

Furthermore, the characteristic configurations shown in Preferred Embodiments 1 to 6 of the present invention as described above can be naturally combined with each other, without departing the spirit of the present invention.

As just described, the preferred embodiments disclosed herein by way of example in all respects are not considered to be restrictive. The technical scope of the present invention is defined by what is claimed, and considered to encompass all changes within the spirit and scope equivalent to what is claimed.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A laminated capacitor mounted structure comprising:
a wiring substrate;
a joint material; and
a laminated capacitor mounted on the wiring substrate via the joint material; wherein
the laminated capacitor includes a body including dielectric layers and internal electrode layers alternately stacked, and an external electrode connected to at least a portion of the internal electrode layers;
the body includes a first principal surface and a second principal surface opposed to each other, and side surfaces connecting the first principal surface and the second principal surface;
the laminated capacitor is mounted on the wiring substrate, with the first principal surface of the body opposed to a main surface of the wiring substrate;
the external electrode includes a side surface coating portion coating the side surface of the body;
the wiring substrate includes a land on the main surface;
the joint material is joined to the side surface coating portion and the land, and covers at least a portion of the outer surface of the side surface coating portion and at least a portion of the outer surface of the land; and
a constricted portion is provided at a surface of the joint material located between an outer end portion of the thickest portion of the joint material covering the side surface coating portion and an outer end of the land.

2. The laminated capacitor mounted structure according to claim 1, wherein the constricted portion is partially located inside the outer end of the land in a direction perpendicular or substantially perpendicular to the side surface of the body.

3. The laminated capacitor mounted structure according to claim 1, wherein the joint material covers the side surface coating portion, and includes a bulged portion so as to be spaced away from the body.

4. The laminated capacitor mounted structure according to claim 1, wherein the outer end portion is located farther outside the outer end of the land in a direction perpendicular or substantially perpendicular to the side surface of the body.

5. The laminated capacitor mounted structure according to claim 1, wherein the constricted portion is located between the internal electrode layer closest to the first principal surface among the internal electrode layers and the land in a direction perpendicular or substantially perpendicular to the first principal surface.

6. The laminated capacitor mounted structure according to claim 1, wherein the outer end of the land is located in a same position as, or inside an outer surface of the side surface coating portion in a direction perpendicular or substantially perpendicular to the side surface of the body.

7. The laminated capacitor mounted structure according to claim 1, wherein
a stacking direction of the dielectric layers and the internal electrode layers is perpendicular or substantially perpendicular to the main surface of the wiring substrate; and
the dielectric layer defining the first principal surface among the dielectric layers is larger in thickness than the dielectric layer defining the second principal surface among the dielectric layers.

8. The laminated capacitor mounted structure according to claim 1, wherein
a stacking direction of the dielectric layers and the internal electrode layers is perpendicular or substantially perpendicular to the main surface of the wiring substrate;
the body includes a first capacitance portion and a second capacitance portion separated in the stacking direction by a separation portion that does not generate capacitance;
a total number of the internal electrode layers included in the first capacitance portion is larger than a total number of the internal electrode layers included in the second capacitance portion;
a total thickness of the first capacitance portion is larger than a total thickness of the second capacitance portion; and
the first capacitance portion is located between the second principal surface and the second capacitance portion.

9. The laminated capacitor mounted structure according to claim 8, wherein a thickness of the separation portion is larger than both a space in the stacking direction between the internal electrode layers included in the first capacitance portion and a space in the stacking direction between the internal electrode layers included in the second capacitance portion.

10. A laminated capacitor mounted structure comprising:
a wiring substrate;
a joint material; and
a laminated capacitor mounted on the wiring substrate via the joint material; wherein
the laminated capacitor includes a body including dielectric layers and internal electrode layers alternately stacked, and an external electrode connected to at least a portion of the internal electrode layers;
the body includes a first principal surface and a second principal surface opposed to each other, and side surfaces connecting the first principal surface and the second principal surface;
the laminated capacitor is mounted on the wiring substrate, with the first principal surface of the body opposed to a main surface of the wiring substrate;
the external electrode includes a side surface coating portion coating the side surface of the body;
the wiring substrate includes a land on the main surface;
the joint material is joined to the side surface coating portion and the land, and covers at least a portion of the outer surface of the side surface coating portion and at least a portion of the outer surface of the land; and
the joint material covers the side surface coating portion, and includes a bulged portion so as to be spaced away from the body.

11. The laminated capacitor mounted structure according to claim 10, wherein the outer end portion of the thickest portion of the joint material covering the side surface coating portion is located farther outside the outer end of the land in a direction perpendicular or substantially perpendicular to the side surface of the body.

12. The laminated capacitor mounted structure according to claim 10, wherein the outer end of the land is located in a same position as, or inside an outer surface of the side surface coating portion in a direction perpendicular or substantially perpendicular to the side surface of the body.

13. The laminated capacitor mounted structure according to claim 10, wherein
a stacking direction of the dielectric layers and the internal electrode layers is perpendicular or substantially perpendicular to the main surface of the wiring substrate; and
the dielectric layer defining the first principal surface among the dielectric layers is larger in thickness than the dielectric layer defining the second principal surface among the dielectric layers.

14. The laminated capacitor mounted structure according to claim 10, wherein
a stacking direction of the dielectric layers and the internal electrode layers is perpendicular or substantially perpendicular to the main surface of the wiring substrate;
the body includes a first capacitance portion and a second capacitance portion separated in the stacking direction by a separation portion that does not generate capacitance;
a total number of the internal electrode layers included in the first capacitance portion is larger than a total number of the internal electrode layers included in the second capacitance portion;

a total thickness of the first capacitance portion is larger than a total thickness of the second capacitance portion; and
the first capacitance portion is located between the second principal surface and the second capacitance portion.

15. The laminated capacitor mounted structure according to claim 14, wherein a thickness of the separation portion is larger than both a space in the stacking direction between the internal electrode layers included in the first capacitance portion and a space in the stacking direction between the internal electrode layers included in the second capacitance portion.

16. A laminated capacitor mounted structure comprising:
a wiring substrate;
a joint material; and
a laminated capacitor mounted on the wiring substrate via the joint material; wherein
the laminated capacitor includes a body including dielectric layers and internal electrode layers alternately stacked, and an external electrode connected to at least a portion of the internal electrode layers;
the body includes a first principal surface and a second principal surface opposed to each other, and side surfaces connecting the first principal surface and the second principal surface;
the laminated capacitor is mounted on the wiring substrate, with the first principal surface of the body opposed to a main surface of the wiring substrate;
the external electrode includes a side surface coating portion coating the side surface of the body;
the wiring substrate includes a land on the main surface;
the joint material is joined to the side surface coating portion and the land, and covers at least a portion of the outer surface of the side surface coating portion and at least a portion of the outer surface of the land; and
the outer end portion of the thickest portion of the joint material covering the side surface coating portion is located farther outside the outer end of the land in a direction perpendicular or substantially perpendicular to the side surface of the body.

17. The laminated capacitor mounted structure according to claim 16, wherein the outer end of the land is located in a same position as, or inside an outer surface of the side surface coating portion in a direction perpendicular or substantially perpendicular to the side surface of the body.

18. The laminated capacitor mounted structure according to claim 16, wherein
a stacking direction of the dielectric layers and the internal electrode layers is perpendicular or substantially perpendicular to the main surface of the wiring substrate;
the dielectric layer defining the first principal surface among the dielectric layers is larger in thickness than the dielectric layer defining the second principal surface among the dielectric layers.

19. The laminated capacitor mounted structure according to claim 16, wherein
a stacking direction of the dielectric layers and the internal electrode layers is perpendicular or substantially perpendicular to the main surface of the wiring substrate;
the body includes a first capacitance portion and a second capacitance portion separated in the stacking direction by a separation portion that does not generate capacitance;
a total number of the internal electrode layers included in the first capacitance portion is larger than a total number of the internal electrode layers included in the second capacitance portion;

a total thickness of the first capacitance portion is larger than a total thickness of the second capacitance portion; and the first capacitance portion is located between the second principal surface and the second capacitance portion.

20. The laminated capacitor mounted structure according to claim 19, wherein a thickness of the separation portion is larger than both a space in the stacking direction between the internal electrode layers included in the first capacitance portion and a space in the stacking direction between the internal electrode layers included in the second capacitance portion.

* * * * *